(12) United States Patent
Tomar et al.

(10) Patent No.: US 10,897,132 B2
(45) Date of Patent: Jan. 19, 2021

(54) ELECTROSTATIC DISCHARGE PROTECTION CIRCUIT AND DESIGN

(71) Applicant: Western Digital Technologies, Inc., San Jose, CA (US)

(72) Inventors: Bhawna Tomar, Bangalore (IN); Rohith Aravind Mahale, Bangalore (IN); Seema Malhotra, Bangalore (IN); Ajay Kanth Chitturi, Visakhapatnam (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 210 days.

(21) Appl. No.: 16/146,900

(22) Filed: Sep. 28, 2018

(65) Prior Publication Data
US 2020/0106266 A1 Apr. 2, 2020

(51) Int. Cl.
*H02H 9/04* (2006.01)
*H01L 27/02* (2006.01)

(52) U.S. Cl.
CPC ......... *H02H 9/046* (2013.01); *H01L 27/0207* (2013.01); *H01L 27/0266* (2013.01)

(58) Field of Classification Search
CPC ........ H02H 9/046; H02H 1/0007; H02H 1/04; H02H 9/04; H01L 27/0266
See application file for complete search history.

(56) References Cited

U.S. PATENT DOCUMENTS

| | | | |
|---|---|---|---|
| 2009/0094568 A1* | 4/2009 | Shukla | G06F 30/398 716/106 |
| 2017/0373494 A1* | 12/2017 | Pok | H01L 27/0251 |
| 2019/0128939 A1* | 5/2019 | O'Donnell | H02H 1/0007 |

\* cited by examiner

*Primary Examiner* — Gary L Laxton
(74) *Attorney, Agent, or Firm* — Loza & Loza, LLP; Gabriel Fitch

(57) ABSTRACT

Electrostatic discharge (ESD) protection for an electronic circuit includes a timer circuit that controls multiple clamp circuits. In this way, less circuit area may be used for the timer circuit as compared to conventional ESD protection schemes. In some embodiments, the ESD protection circuit is employed in a data storage apparatus that includes a non-volatile memory array (e.g., NAND devices).

20 Claims, 18 Drawing Sheets

ELECTROSTATIC DISCHARGE PROTECTION CIRCUIT AND DESIGN

FIELD

The disclosure relates, in some embodiments, to electrostatic discharge protection circuits and associated design processes. More specifically, but not exclusively, the disclosure relates to electrostatic discharge protection circuits for a non-volatile memory (NVM) array and the design thereof.

INTRODUCTION

An electronic circuit may include electrostatic discharge (ESD) protection to prevent an ESD event from damaging the electronic circuit. For example, an ESD protection circuit may include a clamp circuit that limits the magnitude of an ESD voltage to a level that will not damage the electronic circuit.

In practice, ESD protection circuits may be relatively large. However, in electronic circuits such as integrated circuits, it is desirable to use as much of the available circuit area as possible for the functional circuits (e.g., a memory array, processing circuits, etc.). Thus, there is a need for effective techniques for providing ESD protection without consuming a large amount of the circuit area of an electronic circuit.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an electrostatic discharge protection circuit that includes: a first clamp circuit; a second clamp circuit; a first driver circuit coupled to the first clamp circuit to turn on the first clamp circuit in response to an electrostatic discharge event; a second driver circuit coupled to the second clamp circuit to turn on the second clamp circuit in response to the electrostatic discharge event; and a first timer circuit coupled to the first driver circuit and the second driver circuit to turn off the first clamp circuit and the second clamp circuit after a delay period following the electrostatic discharge event.

One embodiment of the disclosure provides an electrostatic discharge protection circuit that includes: a plurality of means for clamping; a plurality of means for turning on the plurality of means for clamping in response to an electrostatic discharge event; and a means for turning off the plurality of means for clamping after a delay period following the electrostatic discharge event.

One embodiment of the disclosure provides a data storage apparatus that includes: a non-volatile memory array; an interface coupled to the interface non-volatile memory array and comprising at least one input-output pad; and an electrostatic discharge protection circuit comprising: a plurality of clamp circuits coupled to the at least one input-output pad, a plurality of driver circuits coupled to the plurality of clamp circuits, and a timer circuit coupled to the plurality of driver circuits.

One embodiment of the disclosure provides a circuit design method that includes: receiving information for a timing circuit for electrostatic discharge protection, a plurality of clamp circuits for the electrostatic discharge protection, and a plurality of driver circuits for the electrostatic discharge protection; determining a location of the timing circuit within a circuit layout; determining locations of the plurality of clamp circuits within the circuit layout; determining locations of the plurality of driver circuits within the circuit layout; routing at least one signal trace between the timing circuit and the plurality of driver circuits within the circuit layout; routing a plurality of signal traces between the plurality of driver circuits and the plurality of clamp circuits within the circuit layout; generating a digital representation of the circuit layout; and storing the digital representation of the circuit layout in a memory device.

One embodiment of the disclosure provides a circuit design apparatus that includes: a memory device; and a processor coupled to the memory device. The processor is configured to: receive information for a timing circuit for electrostatic discharge protection, a plurality of clamp circuits for the electrostatic discharge protection, and a plurality of driver circuits for the electrostatic discharge protection; determine a location of the timing circuit within a circuit layout; determine locations of the plurality of clamp circuits within the circuit layout; determine locations of the plurality of driver circuits within the circuit layout; route at least one signal trace between the timing circuit and the plurality of driver circuits within the circuit layout; route a plurality of signal traces between the plurality of driver circuits and the plurality of clamp circuits within the circuit layout; generate a digital representation of the circuit layout; and store the digital representation of the circuit layout in a memory device.

One embodiment of the disclosure provides a non-transitory computer-readable medium storing computer-executable code for storing data. In one example, the computer-readable medium includes code to: receive information for a timing circuit for electrostatic discharge protection, a plurality of clamp circuits for the electrostatic discharge protection, and a plurality of driver circuits for the electrostatic discharge protection; determine a location of the timing circuit within a circuit layout; determine locations of the plurality of clamp circuits within the circuit layout; determine locations of the plurality of driver circuits within the circuit layout; route at least one signal trace between the timing circuit and the plurality of driver circuits within the circuit layout; route a plurality of signal traces between the plurality of driver circuits and the plurality of clamp circuits within the circuit layout; generate a digital representation of the circuit layout; and store the digital representation of the circuit layout in a memory device.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The disclosure relates in some aspects to ESD protection for an electronic circuit. In some aspects, the ESD protection includes a timer circuit that controls multiple clamp circuits. In this way, less circuit area may be used for the timer circuit as compared to conventional ESD protection schemes. In some embodiments, the ESD protection circuit is employed in a data storage apparatus that includes a non-volatile memory array.

Figure 1:
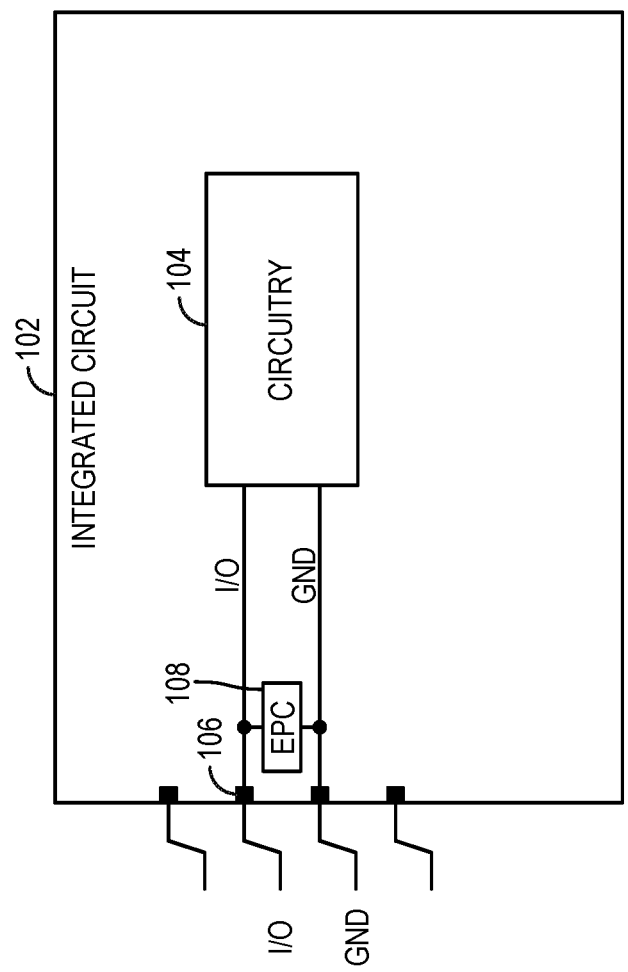
FIG. 1 illustrates an integrated circuit including ESD protection in accordance with one or more aspects of the disclosure.

FIG. 1 illustrates an example of an integrated circuit 102 that includes circuitry 104 that is connected to an external signal node (e.g., a pad) 106. As used herein, the term external signal node (or external signal path) refers to a node (or path) that can connect to circuitry external to an integrated circuit (or some other circuit that includes the node or path). In the example of FIG. 1, the external signal node 106 is for input/output (I/O) signaling. An external signal node (or path) could be used for other types of signals. For example, an external signal node could be for an external decoupling capacitor. As another example, an external signal node could be for an internal node (e.g., a test pad that is used only for testing) that is not bonded out.

The integrated circuit 102 includes an ESD protection circuit (EPC) 108 for protecting the circuitry 104 in the event an ESD event occurs at the external signal node 106. Other external signal pads may be connected to similar ESD protection circuits (not shown). The ESD protection circuit 108 includes clamps and/or diodes that limit the voltage during an ESD event so that the voltage remains below a destructive voltage for the circuitry 102, thereby protecting the circuitry 102. In the example of FIG. 1, an ESD event at the external signal node 106 may cause the ESD protection circuit 108 to temporarily couple the external signal node 106 to ground (GND). By redirecting current flow caused by the ESD event to flow to ground, the magnitude of the voltage inducted at the circuitry 104 can be controlled to an acceptable level.

Figure 2:
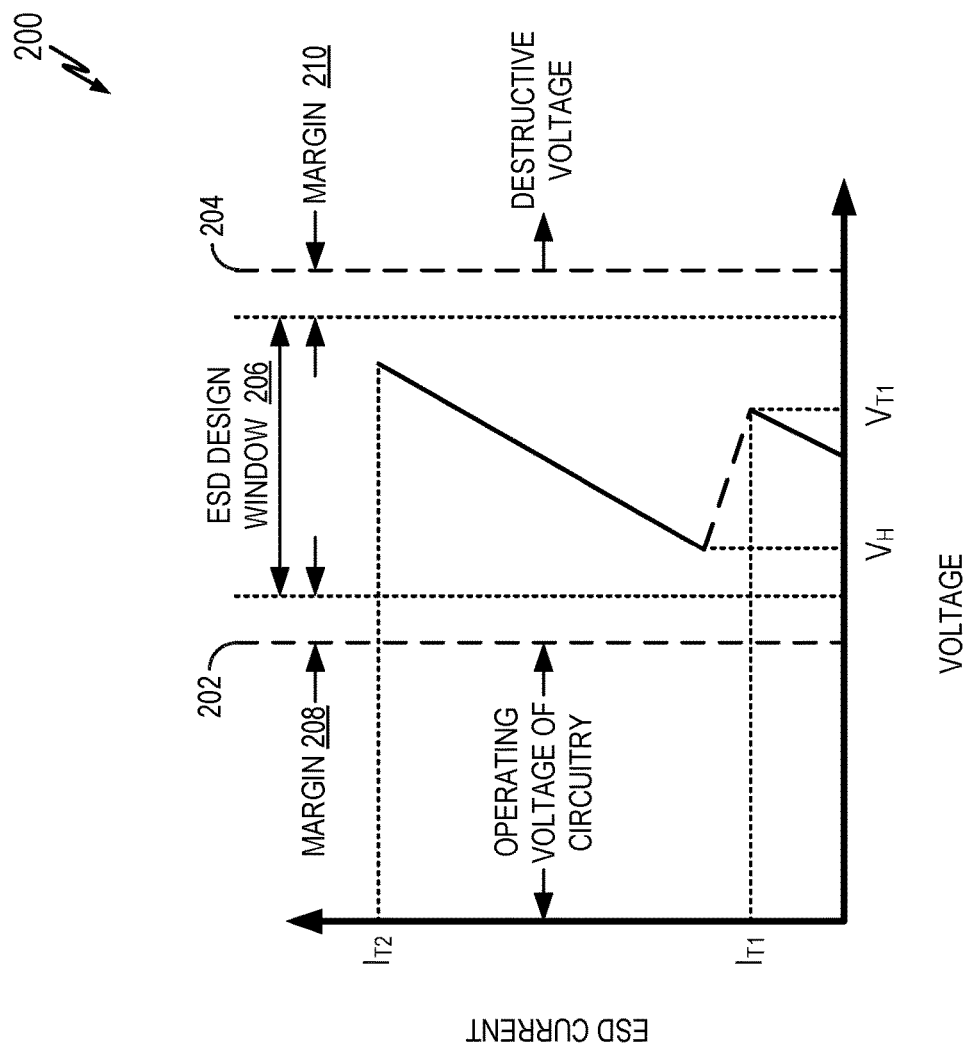
FIG. 2 illustrates an example of an ESD design window.

FIG. 2 illustrates an example of an ESD design window 200 for protecting an electronic circuit. The X-axis is the voltage at the electronic circuit (e.g., an input of a transistor) and the Y-axis is the current resulting from the ESD event. The electronic circuit has a maximum operating voltage 202 and a destructive voltage 204 (e.g., a breakdown voltage) that depend on the particular technology being used. An ESD protection circuit is designed to prevent the ESD-induced voltage from exceeding the destructive voltage at the input to the electronic circuit, without causing the voltage input to the electronic circuit to drop below the operating voltage range (e.g., a direct short to ground is not desired). Thus, in the above example, the ESD design window 206 is on the order of 2 V.

The following terminology is used in FIG. 2. $V_{T1}$ is the triggering voltage that triggers activation of the ESD protection circuit (e.g., turning on a clamp and/or diode circuit). $I_{T1}$ is the triggering current (e.g., the current flow at $V_{T1}$). $V_H$ is the holding voltage (e.g., if there is a voltage snapback at the ESD protection circuit). $I_{T2}$ is the current failure threshold (e.g., current exceeding this threshold may damage the electronic circuit). $V_{T2}$ is the voltage at $I_{T2}$. FIG. 2 also shows a margin 208 for the maximum operating voltage 202 and a margin 210 for the destructive voltage 204 corresponding to, for example, process and temperature variations.

Typically, an ESD protection circuit includes a clamp circuit that is controlled to control (e.g., turn on/off) the gate of one or more NMOS devices that serve as a clamp. Such a circuit may include protection diodes and resistors to divert the charge of an ESD event to the NMOS device(s) and/or pads associated with a reference node. In an ESD event that occurs between two I/O pads, the accumulated charge will try to find a path to the reference node.

Figure 3:
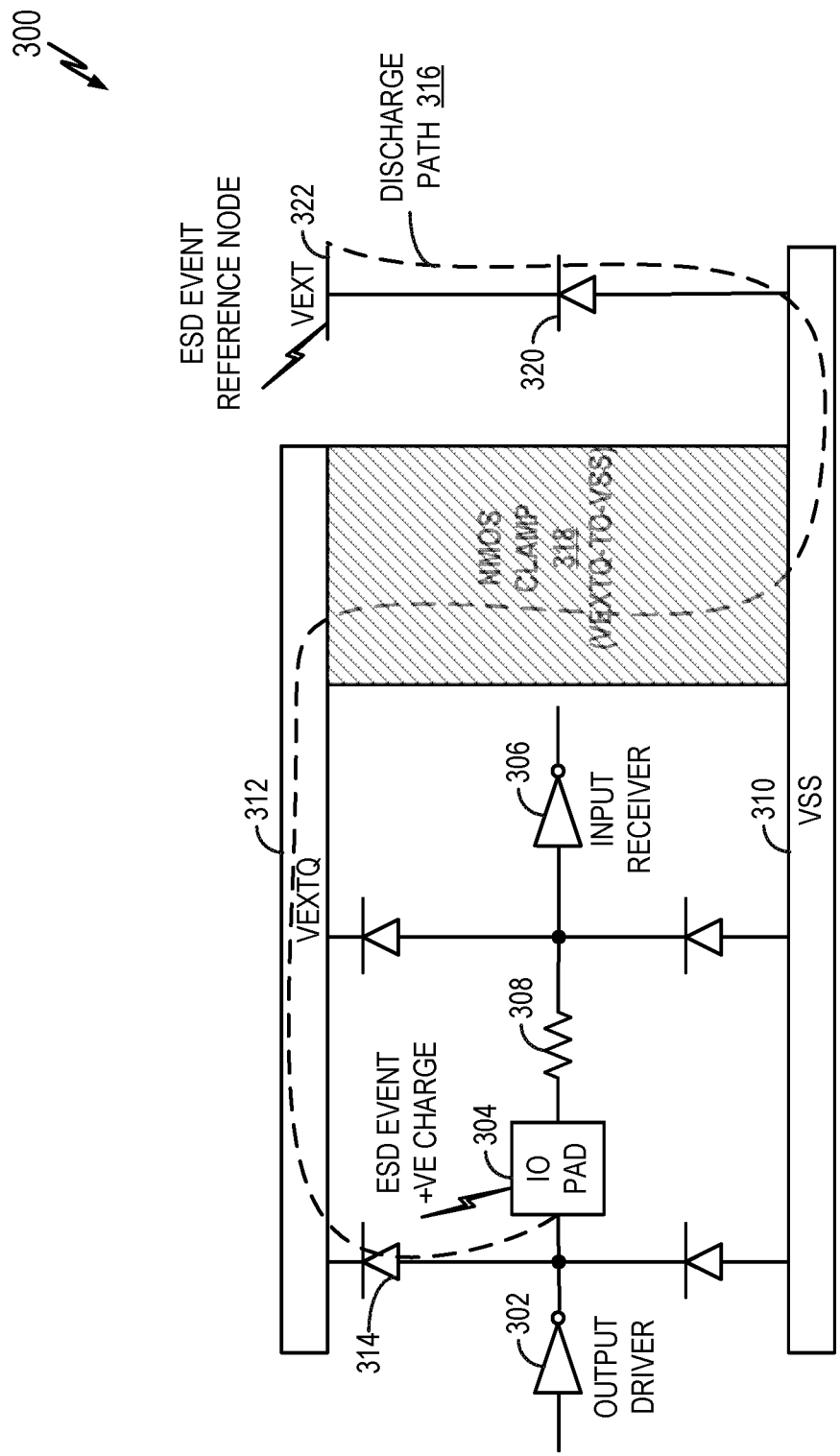
FIG. 3 illustrates an example of a current path for an ESD event.

FIG. 3 illustrates an example of an ESD event on an I/O circuit 300, along with circuit elements that assist the discharge to limit the peak voltage, and thus protect the I/O circuit 300. The I/O circuit 300 includes an output driver 302 coupled to an I/O pad 304, along with an input receiver 306 coupled to the I/O pad 304 via a resistor 308. These components are coupled to a VSS path 310 and an external signal path (VEXTQ) 312 via protection diodes (e.g., including the diode 314).

When an ESD event (e.g., a +ve charge) occurs at the I/O pad 304, the protection diodes provide a discharge path 316 from the I/O pad 304 to a power pad in a different power domain (e.g., to a reference power bus). Specifically, discharge current may flow from the I/O pad 304, through the diode 314, the VEXTQ path 312), an NMOS clamp 318 (across VEXT and VSS), the VSS path 310, and a diode 320 to a reference node 322 (VEXT).

Conventionally, an ESD protection circuit includes a driver stage that turns on the NMOS clamp when an ESD event occurs. The driver stage provides current path to charge the gate of the NMOS clamp and thereby achieve the clamping action.

An ESD protection circuit may also include timing elements that turn off the NMOS clamp after the ESD event is over and that do not let the NMOS clamp turn on during a power-up condition (e.g., when a chip is in a normal operating mode). For example, a timer circuit may ensure that the NMOS clamp turns off after discharging the ESD charge to a voltage level that is below the functional stress level. To this end, the timer circuit may provide a delay on the order of micro seconds or more.

Conventionally, an ESD design uses relatively large active circuit elements and passive circuit elements. For example, since ESD protection is desirable even when an integrated circuit chip is not operating in its normal function mode (e.g., during manufacture and test), passive elements are typically used to provide ESD protection. Thus, relatively large passive elements such as resistors and capacitors may be used to provide the timing delay discussed above. In addition, NMOS clamps may need to be relatively large to withstand ESD stress. Consequently, these circuit elements may take up a relatively large area (e.g., 10%-20%) of an integrated circuit chip (or other circuit).

Moreover, conventional ESD designs may consume a relatively large amount of power. For example, the active circuitry (e.g., the NMOS clamp) of an ESD protection circuit may have significant leakage when a chip is operating in its normal functional mode.

Also, conventional ESD design methodology uses a manual approach for design and placement. Consequently, such a methodology may take a relatively long time to close the design and may result in a relatively long time to market.

In view of the above, there is a need for more effective ESD protection circuit. In addition, there is a need for a more efficient design methodology for ESD protection.

Figure 4:
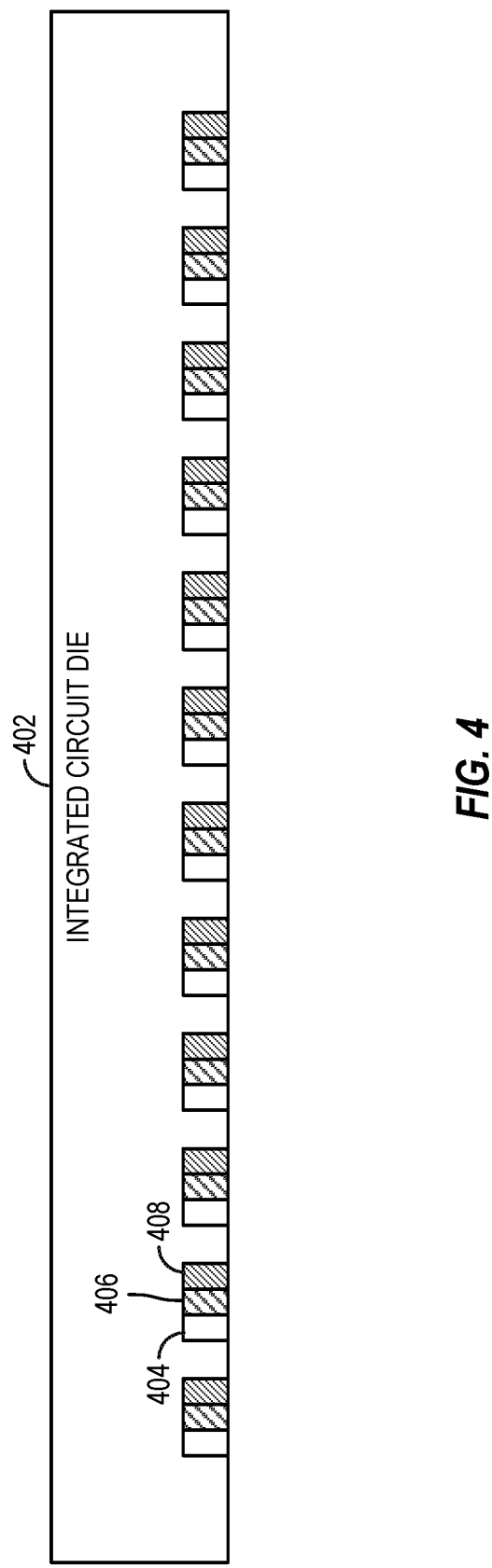
FIG. 4 illustrates an example layout of ESD protection circuits.

Conventionally, the timer circuit, the driver circuit, and the NMOS clamp are made as one entity in layout and replicated close to each power pad. See FIG. 4 which shows an integrated circuit die 402 that includes several instances of such an entity, each of which includes a timer circuit 404, a driver circuit 406, and an NMOS clamp 408. This design results in the ESD protection circuit taking up a large area in the chip design.

The disclosure relates in some aspects to sharing the timer circuit among several NMOS clamps. That is, a single timer circuit is used to turn off multiple NMOS clamps. Consequently, the amount of real estate used for the ESD protection circuit can be reduced.

Figure 5:
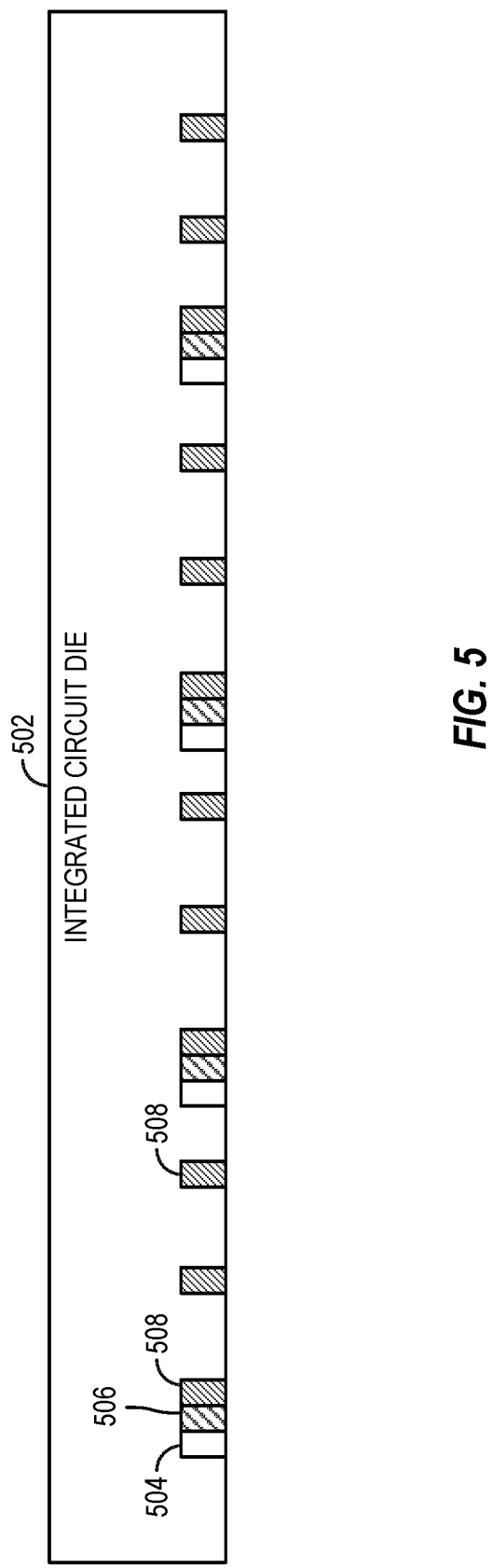
FIG. 5 illustrates an example layout of ESD protection circuits in accordance with one or more aspects of the disclosure.

FIG. 5 illustrates an embodiment where the timer circuit and the driver circuit are shared among several NMOS clamps. Here, an integrated circuit die 502 includes several instance of a timer circuit 504, a driver circuit 506, and an NMOS clamp 508, where a given timer circuit and driver circuit pair controls several NMOS clamps 508. The sharing in such a design may be limited to maintain tighter control on performance and timing.

The NMOS clamp turn-on time depends on the driver circuit that provides a current path to charge the gate of the NMOS clamp and thereby achieve clamping action. The NMOS clamp turn-off time, on the other hand, depends on the timer circuit that functions as a low pass filter to turn off the NMOS clamp after a sufficient amount of time has passed for the discharging of the ESD charge. In practice, the turn-on time may be more critical in an ESD protection design than the turn-off time. For example, it is important that an NMOS clamp be turned-on quickly to prevent and ESD event from damaging the circuitry being protected. However, as long as the minimum on-time for the NMOS clamp is met, the turn-off time is not as critical (e.g., the NMOS clamp may be turned off later).

Figure 6:
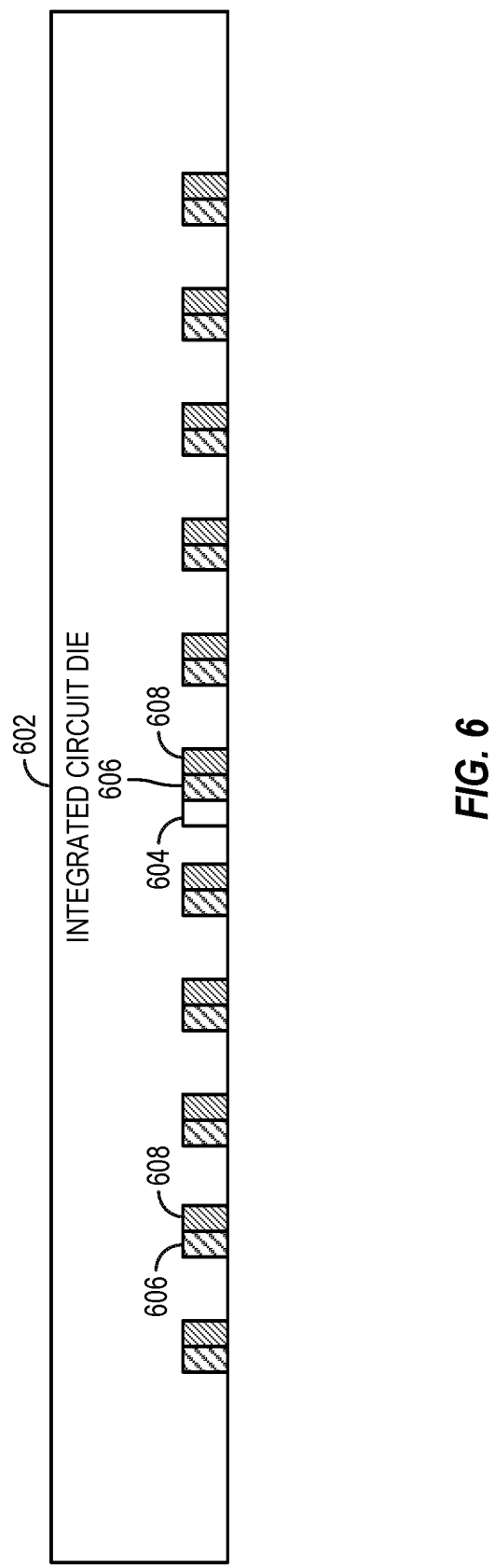
FIG. 6 illustrates an example layout of ESD protection circuits in accordance with one or more aspects of the disclosure.

Accordingly, the disclosure relates in some aspects to sharing a timer circuit among multiple driver circuits and NMOS clamps. That is, the timer circuit, the driver circuit, and the NMOS clamp may be split into two blocks where the driver circuit and the NMOS clamp are in the first block and the timer circuit for turning off the NMOS clamp is in the second block. Thus, a given driver circuit and is kept in close proximity to the NMOS clamp driven by that driver circuit. Keeping the driver circuit and the NMOS clamp together helps to ensures that the turn-on performance is unaffected by the distribution. See FIG. 6 that illustrates an integrated circuit die 602 includes a timer circuit 604 that controls several pairs of a driver circuit 606 and an NMOS clamp 608.

In accordance with the teachings herein, the timer circuit shared across all NMOS clamps may be tuned to compensate for any change in node capacitance due to node (e.g., NMOS clamp) sharing. For example, for different die sizes (e.g., memory die sizes) the chip routing capacitance may be different since the number of shared nodes may change and/or the distances between these elements may change. The intentional capacitor used for the timer device in timer block may therefore be tuned to keep the turn-off timing in the desired range.

Figure 7:
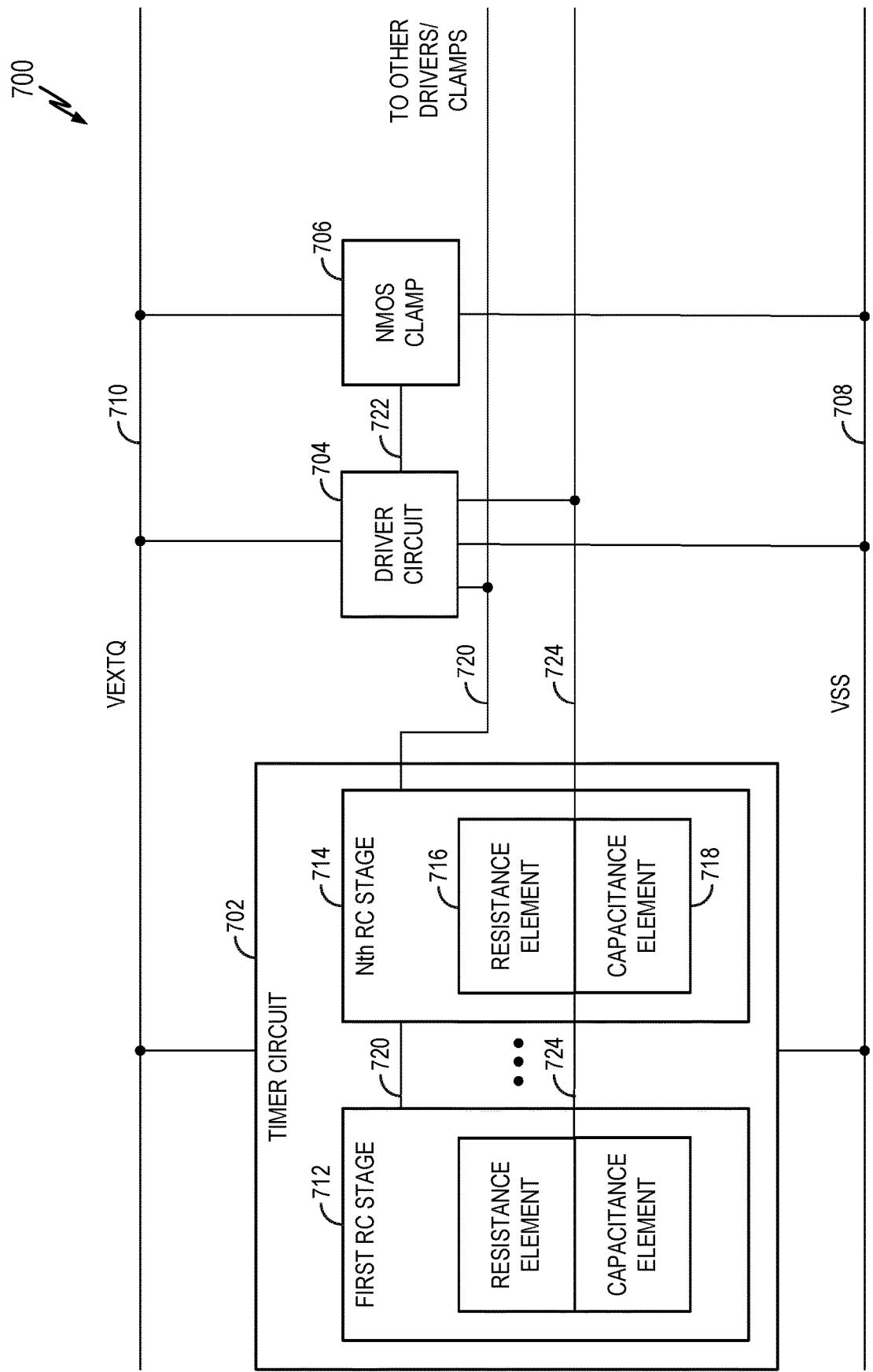
FIG. 7 illustrates an example of an ESD protection circuit in accordance with one or more aspects of the disclosure.

FIG. 7 illustrates an example of an ESD protection circuit 700 that includes a timer circuit 702 that controls a driver circuit 704, an NMOS clamp 706, and other driver circuits and NMOS clamps (not shown). The timer circuit 702, the driver circuit 704, and the NMOS clamp 706 are each connected to a power bus VSS 708 and external signal path VEXTQ 710.

The timer circuit 702 includes several resistance-capacitance (RC) stages (represented by a first RC stage 712 to an Nth RC stage 714) for providing a timing delay. These RC stages may be collectively referred to as an RC filter. Each RC stage includes a resistance element (e.g., one or more resistors) and a capacitance element (e.g., one or more capacitors). For example, as shown in FIG. 7, the Nth RC stage 714 includes a resistance element 716 and a capacitance element 718.

An ESD event on VEXTQ 710 results in the timer circuit 702 generating a signal 720 that causes the driver circuit 704 to turn on the clamp circuit 706. For example, the driver circuit may be an inverter and the signal 720 may control a gate terminal of a transistor of the inverter. The output of the inverter may provide a signal 722 that drives a gate terminal of at least one NMOS transistor of the clamp circuit 706. In general, the ESD protection circuit 700 is designed so that the clamp circuit 706 is turned on very quickly once the ESD event occurs.

The timer circuit 702 subsequently generates a signal 724 that causes the driver circuit 704 to turn off the clamp circuit 706. For example, the ESD event on VEXTQ 710 may trigger the generation of the signal 724 by the RC stages. In some embodiments, the signal 724 may control a gate terminal of another transistor of the inverter described above.

Since the RC stages may act as a low pass filter, the signal 724 is generated a delay period after the signal 720. The duration of the delay is based, at least in part, on the resistance and capacitance of the RC filters, as well as capacitance (e.g., routing capacitance, MOS gate capacitance, parasitic capacitance, etc.) associated with the signal path(s) for the signal 724 and the signals path(s) for the signal 722.

As indicated in FIG. 7, the signal 720 and the signal 724 may control other driver circuits and clamp circuits (not shown). The signal 720 and the signal 724 may each represent one or more signals on one or more signal paths. For example, in some embodiments, a single signal path may be used to couple the signal 720 from the timer circuit 702 to several driver circuits and clamp circuits (including the driver circuit 704 and the NMOS clamp 706). Other embodiments may use several signal paths for the signal 720. For example, a first signal path may couple the signal 720 from the timer circuit 702 to at least one driver circuit and at least one NMOS clamp (e.g., including the driver circuit 704 and the NMOS clamp 706), a second signal path may couple the signal 720 from the timer circuit 702 to at least one other driver circuit and at least one other NMOS clamp, and so on as needed. Similarly, in some embodiments, a single signal path may be used to couple the signal 724 from the timer circuit 702 to several driver circuits and clamp circuits (including the driver circuit 704 and the NMOS clamp 706). Other embodiments may use several signal paths for the signal 724. For example, a first signal path may couple the signal 724 from the timer circuit 702 to at least one driver circuit and at least one NMOS clamp (e.g., including the driver circuit 704 and the NMOS clamp 706), a second signal path may couple the signal 724 from the timer circuit 702 to at least one other driver circuit and at least one other NMOS clamp, and so on as needed.

The duration of the delay may also be based on capacitance associated with routing the signal 724 and the signal 722 for these other driver circuits. To obtain a desired delay, the design of the ESD protection circuit 700 may involve adjusting the capacitance of the timer circuit to account for the capacitance associated with the routing paths for signal 724 and the signal(s) 722. For example, the desired delay may correspond to a required minimum delay for the driver circuit and the clamp circuit closest to the timer circuit 702 (e.g., to ensure that the clamp circuit is on long enough to keep the ESD-induced voltage below the destructive voltage). The resistance and capacitance values of the resistance elements and the capacitance elements could thus be calculated to meet this delay period. This calculated capacitance value may be referred to as an intentional capacitance herein. To account for the capacitance associated with the routing paths for signal 724 and the signal(s) 722, during the design process, the capacitance of the timer circuit (e.g., the capacitance of the capacitive element 718) may be adjusted (e.g., increased or decreased) from the calculated value so that the effective capacitance for the RC filters is equal to the desired capacitance value. The compiler may calculate the routing capacitance, for example, based on the route length and the metal layer(s) being used for the route.

Thus, the disclosures relates in some aspects to a distributed ESD protection design where the timer circuit is shared for all of the ESD clamps by considering the routing capacitance (metal) and tuning an intentional capacitance (e.g., realized by a gate capacitance of a MOS transistor) placed in the design. To get good performance of ESD circuit turn-on during an ESD event, the driver circuit is placed together with its NMOS clamp. Sharing the timer circuit and minimizing the NMOS clamp size results in a smaller design area and lower leakage power.

The disclosure also relates in some aspects to automating the design calculation for the timer circuit based on the routing capacitance and integrated design placement. Here, the routing capacitance and the filter capacitance in the timer circuit for shared nodes may be calculated by a formula fed to the design compiler. The ESD compiler generates front end (design and simulations) and back end (layout and verification) design views by utilizing modular cells, thereby enabling a designer to automate and improve the design efficiency. The compiler supports sharing the RC timing elements of the timer (which take up a large area) across several clamp MOS devices and meets the ESD design window for various memory die sizes. In some aspects, this may improve the turn-around time for subsequent designs. For example, the automated design process may increase designer productivity both in front end processes and back-end processes. Also, for different chip (e.g., memory chips) sizes, a designer may spend less time designing and verifying the integration level designs thorough the use of the techniques described herein.

Figure 8:
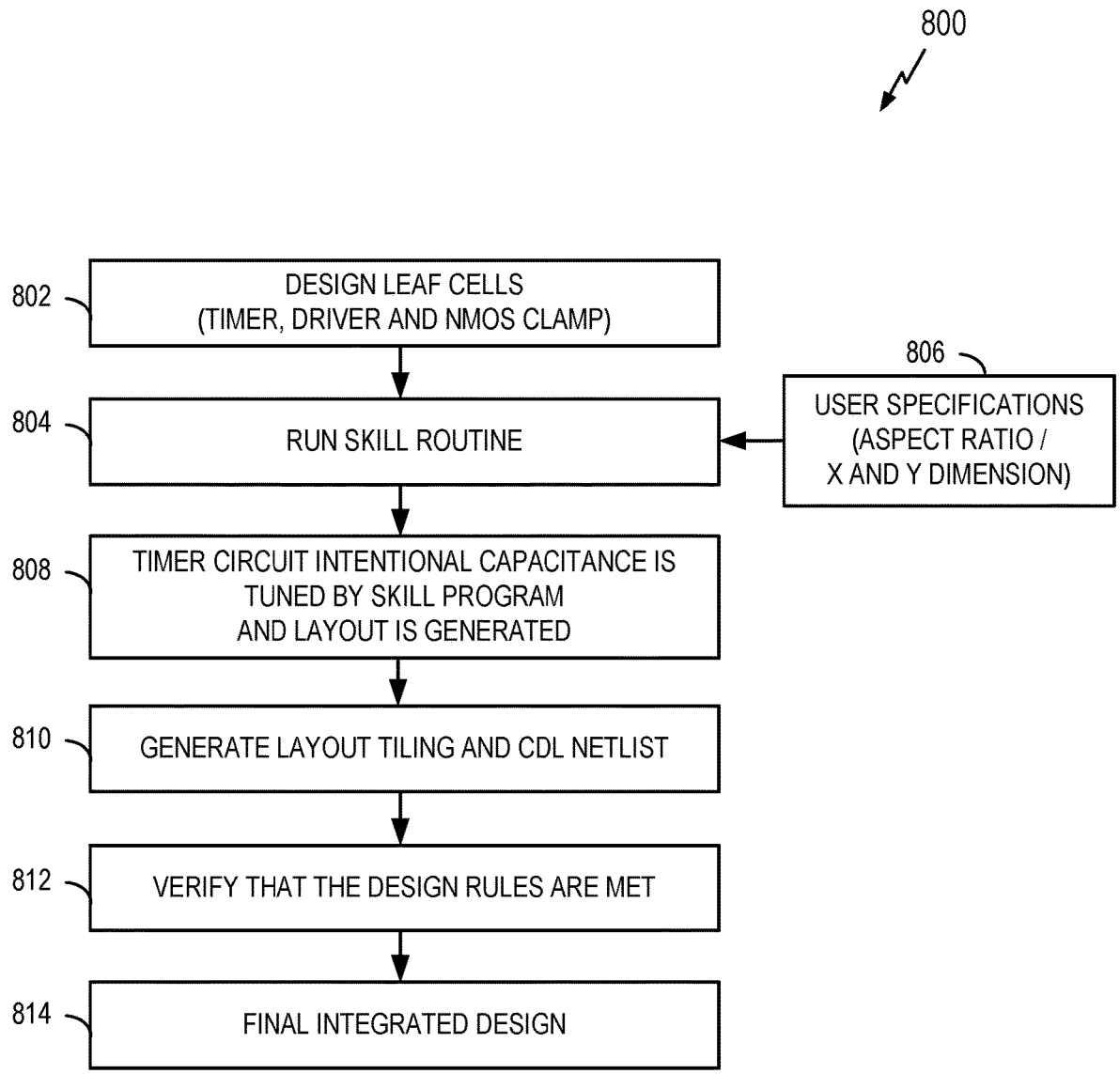
FIG. 8 illustrates an example of ESD design compiler operations in accordance with one or more aspects of the disclosure.

FIG. 8 illustrates an example of ESD design compiler operations 800 in accordance with the teachings herein. A design compiler is a program to generate all design views (e.g., netlist, layout graphic database system (GDS) II, library exchange format (LEF), design exchange format (DEF), etc.) from a base design developed by a circuit designer and a layout designer. The circuit designer and/or the layout designer create modular design cells that can be compiled and tuned for sizes to get a functional design for a given specification.

For an ESD design, placement of the ESD circuits is typically near the chip edge and, as such, the placement is not necessarily limited by placement of other logic circuits on the chip. A modular design approach may advantageously be used to meet the same specifications for different product aspect ratios (e.g., the memory dies for 256G/512G/1T/2T vary in the X dimension). For the first product in given technology, the designer designs the timer circuit, the driver circuit, and the clamp circuit based on the ESD design window. The designer feeds a formula to account for the change in routing capacitance for the distributed driver and clamp circuits to the compiler program. The compiler program calculates the routing capacitance based on the chip width and the placement coordinates fed by the designer, and tunes the intentional capacitance. The compiler then outputs the hierarchical netlist and layout view for the tuned integrated design.

Referring to FIG. 8, at block 802, the designer designs the leaf cells of the design. The leaf cells are the basic blocks of the design and form the block level design. The blocks should be boundary clean for instantiation at top level integration by functions in the compiler program. In some embodiments, the following design criteria may be used for designing the leaf cells.

Leaf cells may be designed considering floor plan, power plan, and signal routings. The ESD protection circuit leaf cells include the RC timer, driver, and the NMOS clamp cells. Leaf cells may be manually drawn and qualified according to applicable electrical design rules (EDR) and graphical design rules (GDR).

Several issues that may be important for the layout of leaf cells follow. Metallization may programmable up to the top metal layer. Via may be maximized for the drivers so that the drivers are able to handle the ESD stress current. Substrate contacts and guard rings may be maximized so that the chances of latch-up are reduced. Cells may be optimized to occupy the least possible area. Guard rings and spacings adhere to ESD and latch-up guidelines.

At block 804 of FIG. 8, a SKILL programming language routine (or other suitable compiler routine) is run to generate the design. Input to the routine include the leaf cell and user specifications 806. The user specifications may include, for example, the aspect ratio (e.g., X and Y dimensions) of the design and coordinates for the design.

At block 808, the SKILL routine tunes the intentional capacitance of the timer circuit (e.g., as discussed herein in conjunction with FIG. 7). In addition, the layout for the top level design is generated.

At block 808, the layout tiling and circuit description language (CDL) netlist for the top level design are generated.

At block 810, the designer verifies that the design rules for the design are met. For example, this may involve design rule checking (DRC), layout versus schematic (LVS), and electromigration IR drop (EMIR) verification for the design.

A final integrated design is thus provided at block 812. For example, the final CDL and GDS of the integrated design may be stored in the final database at this point.

The modular design approach thus involves the design of block-level elements that can be stitched at the top level to get an integrated design at top level. The compiler is fed with designer-controlled, technology-specific values to finetune one or more RC elements based on a change in the loading of the timer circuit node due to sharing and/or due to a change in the aspect ratio of the integrated design. This approach may prove an improvement in terms of area, leakage power saving, and reduced turnaround time for the designer. This approach may also provide a uniform time of turn-on and/or turn-off for all of the clamps through the use of a shared timer (trigger) circuit.

Figure 9:
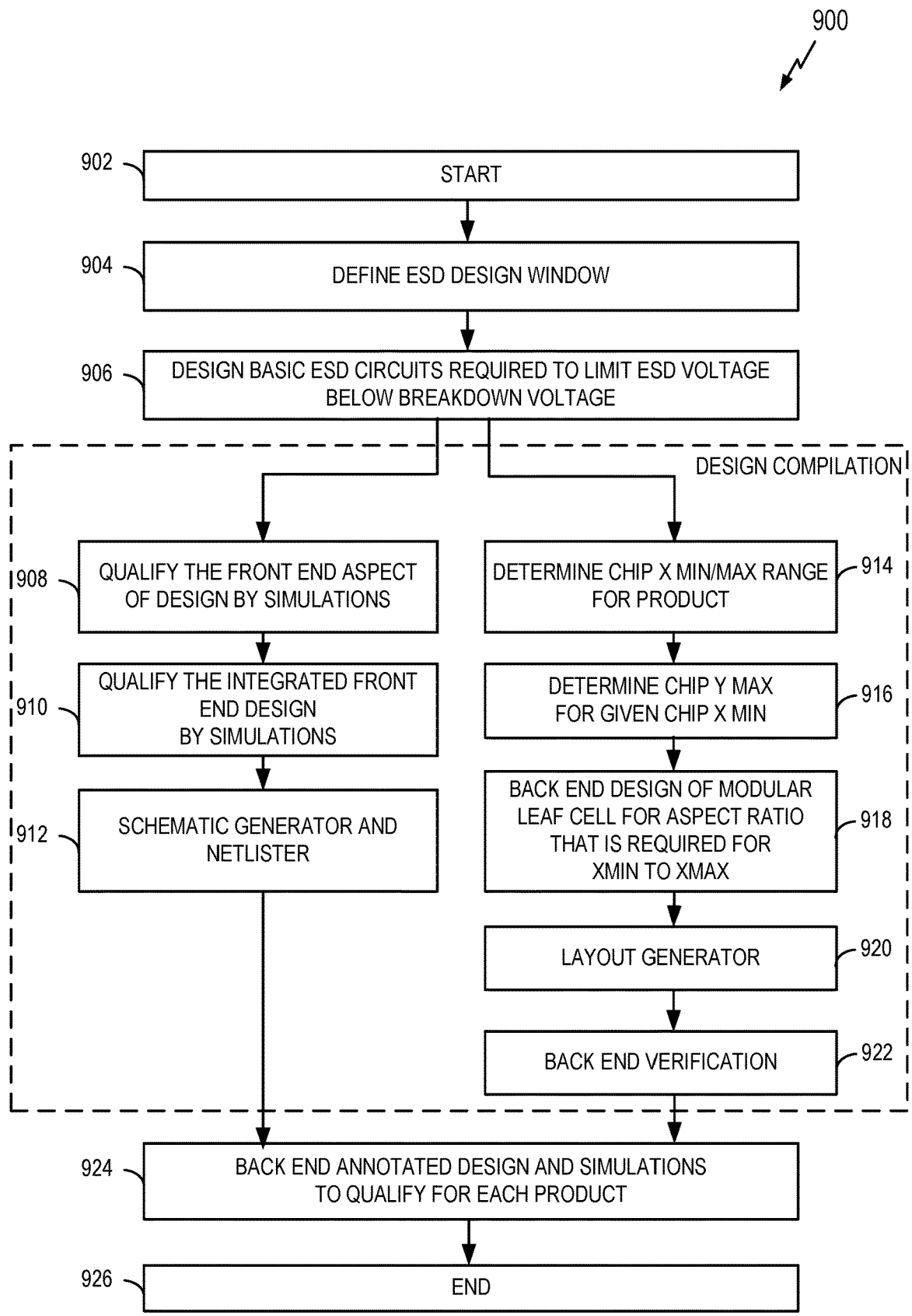
FIG. 9 illustrates an example of an ESD compiler methodology in accordance with one or more aspects of the disclosure.

FIG. 9 illustrates an example of an ESD compiler methodology in accordance with the teachings herein where the ESD compiler may automatically adjust a design for different chip aspect ratios, starting at block 902. At block 904, the designer defines the ESD design window. At block 906, the designer designs the basic ESD protection circuits that are to be used to limit the ESD voltage below the breakdown voltage.

The design compilation for the design (dashed block of FIG. 9) include front end processes (blocks 908-912) and back end processes (blocks 914-918). At block 908, the designer qualifies the front end aspects of the design by simulations. At block 910, the designer qualifies the integrated front end design by simulations. Block 912 corresponds to the schematic generator and netlister operations. At block 914, the compiler determines (e.g., obtains) the X dimension minimum and maximum ranges for the current product line. At block 916, the compiler determines the maximum Y dimension for a chip for a given minimum X dimension. At block 918, the back end design (e.g., as described in FIG. 8) is performed for a modular leaf cell to be used for a chip aspect ratio that is to be used to meet the X dimension minimum and maximum dimensions for the product line. Block 920 corresponds to the layout generator operations (e.g., as described in FIG. 8). Block 922 corresponds to the back end verification operations (e.g., as described in FIG. 8).

At block 924, the back end annotated design and simulation operations are performed for qualify the design for all products in the product line. The process ends at block 926. From the above, it may be seen that the design is automatically generated for different aspect ratios from the basic modular design. For a particular chip, the compiler may redistribute (position) the ESD circuits within the chip, compute the appropriate values (e.g., routing capacitance) for that layout based on the coordinates of the ESD circuits, and use the computed values to determine other values (e.g., the final value for a capacitor of an RC timer). Thus, once the base design is completed, the compiler may be used to automatically generate the design for different products (e.g., with different aspect ratios).

Figure 10:
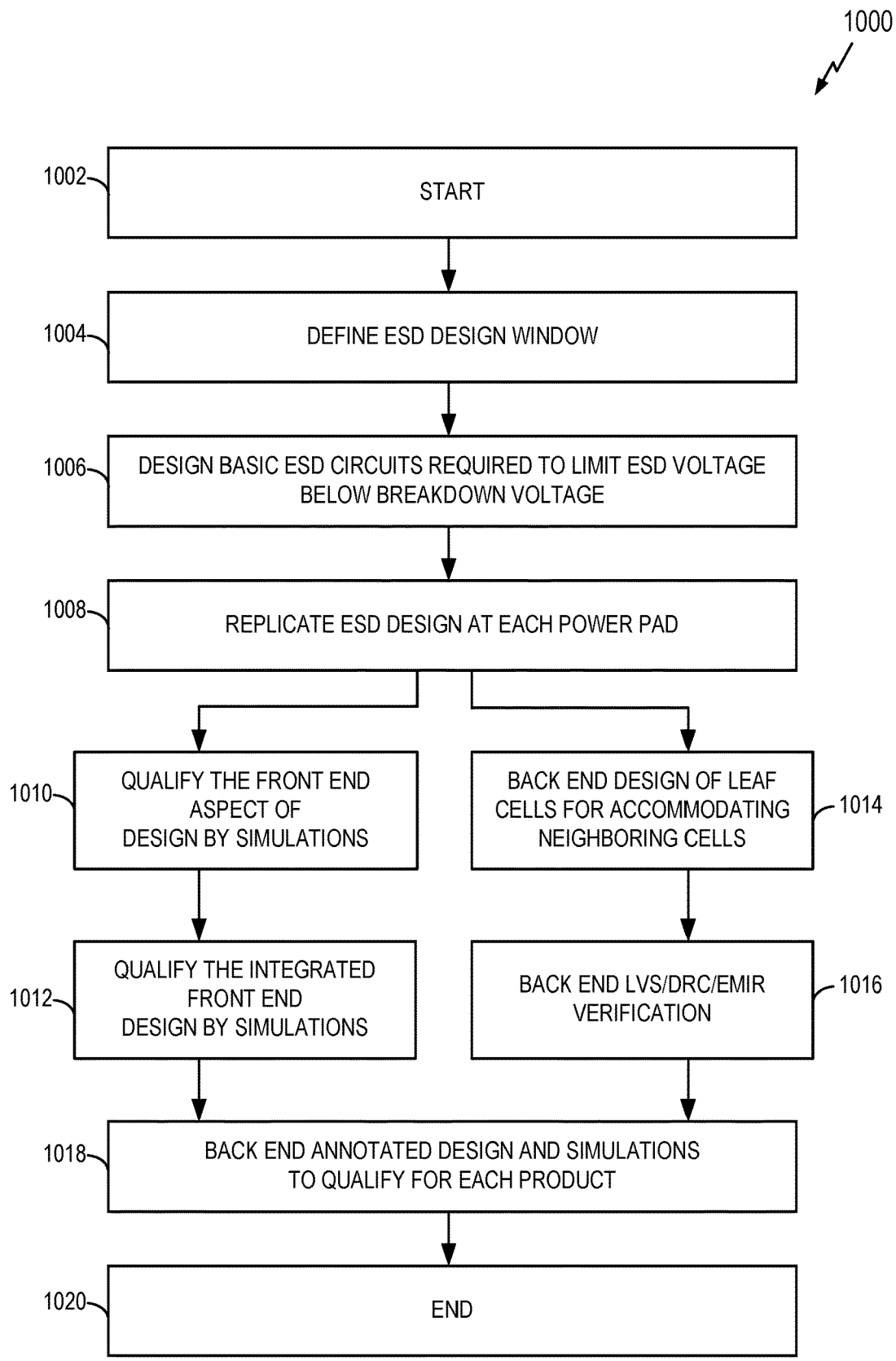
FIG. 10 illustrates an example of a conventional ESD design methodology.

The methodology of FIG. 9 stands in contrast with conventional ESD design methodology where the entire design process must be repeated for each product of a product lineup. FIG. 10 illustrates an example of a conventional ESD design methodology, starting at block 1002. At block 1004, the designer defines the ESD design window. At block 1006, the designer designs the basic ESD protection circuits that are to be used to limit the ESD voltage below the breakdown voltage. At block 1008, the designer replicates the ESD design at each power pad. For the front end operations, the designer qualifies the front end aspects of the design by simulations (block 1010) and qualifies the integrated front end design by simulations (block 1012). For the back end operations, the designer generates the back end design of leaf cells for accommodating neighboring cells (block 1014) and performs LVS, DRC, and EMIR verification (block 1016). At block 1018, the back end annotated design and simulation operations are performed for qualify the design for all products in the product line. The process ends at block 1020. Of note, the above operations are repeated for each product (e.g., products with different aspect ratios). Thus, for various memory size chips, a designer using the conventional approach of FIG. 10 has to spend the same amount of effort designing and verifying the integration level design for each chip, resulting in a tedious and time consuming design and layout process. In contrast, in the modular approach of FIGS. 8 and 9, significant time can be saved which designing products having different aspect ratios.

Figure 11:
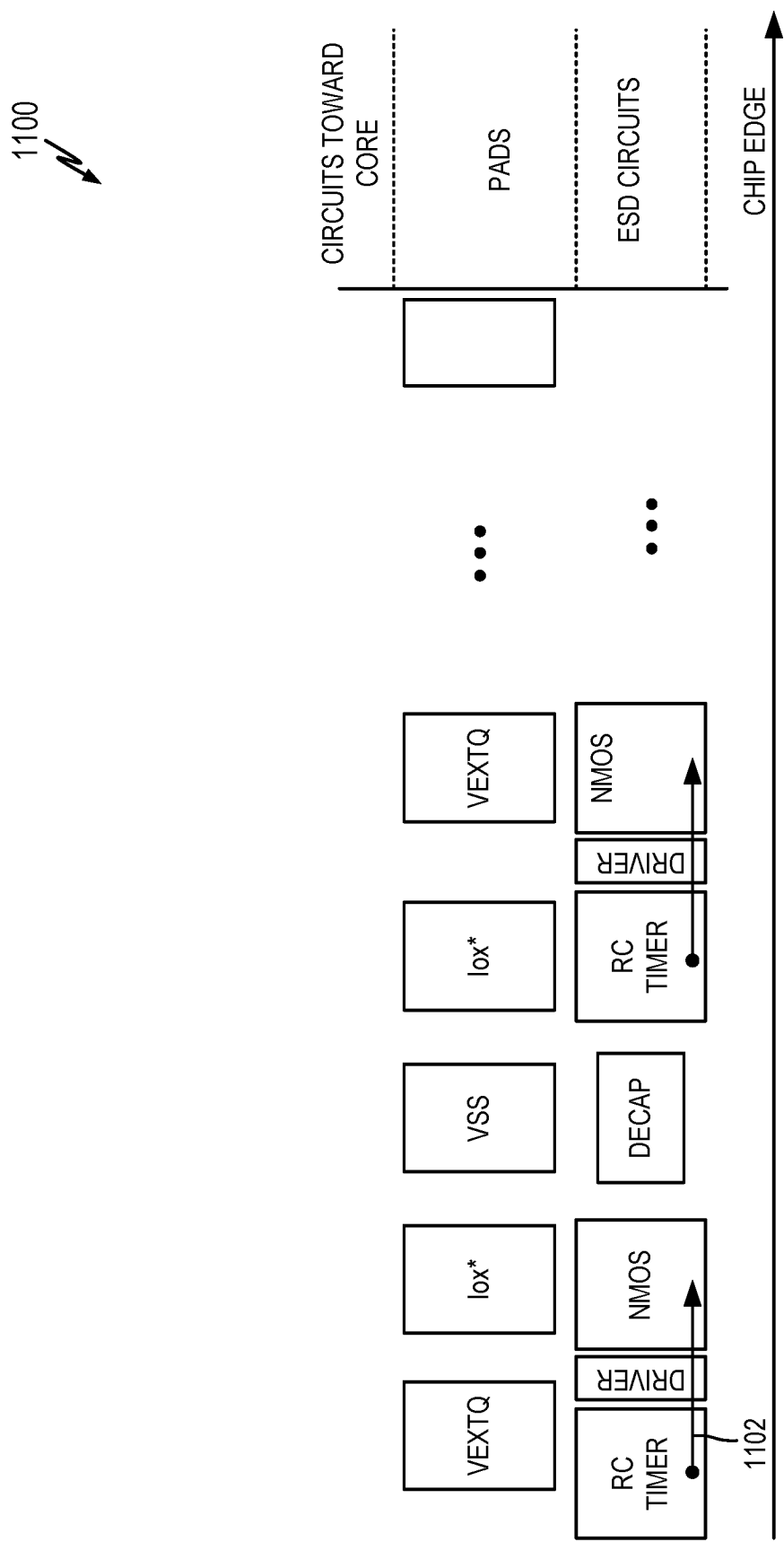
FIG. 11 illustrates an example placement of ESD protection circuits.

Different design objectives may be met when designing products having different aspect ratios in accordance with the teachings herein. FIG. 11 illustrates a block diagram of the placement of ESD protection circuits according to a conventional approach. Here it may be seen that an RC timer, a driver, and an NMOS clamp are placed next to each external pad VEXTQ. In addition, the control signals 1102 from the RC timer control a single driver and NMOS clamp.

Figure 12:
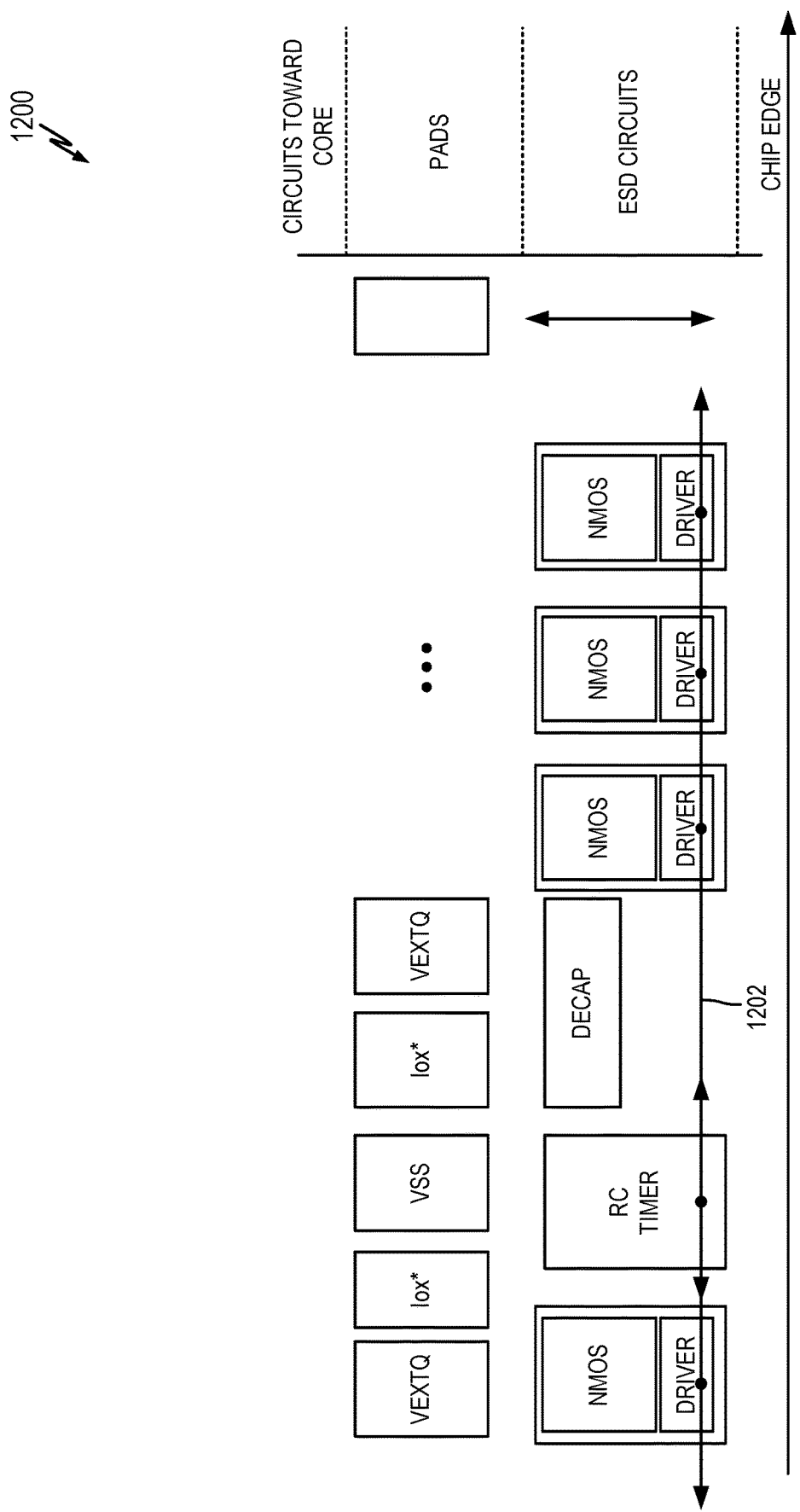
FIG. 12 illustrates an example placement of ESD protection circuits in accordance with one or more aspects of the disclosure.
Figure 13:
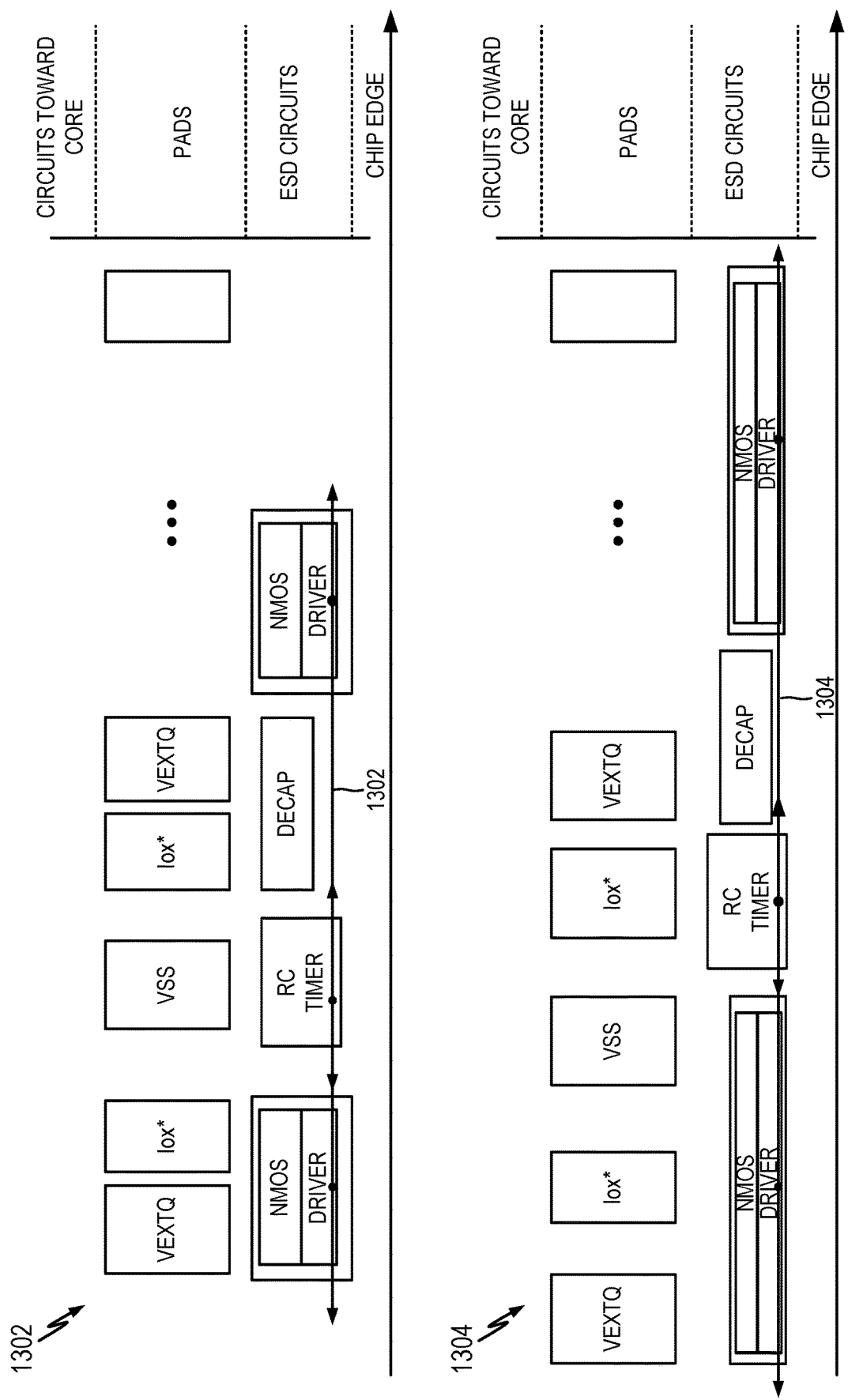
FIG. 13 illustrates an example placement of ESD protection circuits in accordance with one or more aspects of the disclosure.

Block diagrams for layout generation by compilation in accordance with the teachings herein are shown in FIG. 12 and FIG. 13. These figures show how difference aspect ratios of the ESD protection circuits may be used in different embodiments.

The FIG. 12 shows a first approach, referred to herein as a reducing impedance approach, that requires less layout design effort. In this approach the NMOS clamp size along with the driver stage is replicated depending on the chip dimension. For example, the number of driver and clamp circuits controlled by a given timer circuit (RC timer) may depend on the width of the chip (e.g., more replication is used if the chip is wider). Thus, with an increase in die area, this compiler approach is to reduce the impedance for the equivalent NMOS clamp. This approach may provide a low local IR (current*resistance) drop and also provide freed-up area (due to the use of only one RC Timer) that could be used for new logic functions, decap in between the clamp stages, or other purposes. Here, the control signals 1202 from the RC timer control several drivers and NMOS clamps. Based on the incremental addition of NMOS clamps and the drivers depending on the chip width, the compiler program may tune the node capacitance in a corresponding stage of timer to keep the timing within the required range.

FIG. 13 shows a second approach, referred to herein as a constant impedance approach, where the NMOS clamp size (width) is kept nearly constant and distributed to wider chip areas based on the die sizes. Thus, with an increase in die area, the impedance is kept constant for the equivalent NMOS. For this approach, the modular layout cell design gives back the area in the Y dimension of the chip, thus saving the cost per die and also reducing the leakage through the NMOS clamp. In other words, for a wider die, the NMOS clamp and the driver are made thinner (reduced Y dimension). For example, the layout 1302 may represent a compiled layout for a die with twice the X dimension of the layout of FIG. 12, while the layout 1304 may represent a compiled layout for a die with twice the X dimension of the layout 1302. Here, the control signals 1302 or 1304 from an RC timer control several drivers and NMOS clamps. The compiler tunes the intentional capacitance of the RC timer stage based on the routing capacitance associated with any additional driver nodes. The designer qualifies the ESD design window of the final back annotated design simulations to achieve the required specification toward final iteration of the design for incremental requirement of clamp size if required as shown in 1018 of FIG. 10.

As discussed herein, better ESD performance may be achieved by the distributions of FIGS. 12 and 13 since the driver is kept in close proximity to the clamp. For example, the timer may be able to turn off the NMOS clamp with a turn off time on the order of microseconds. In addition, the compiler tunes the intentional capacitor to account for any change in node routing capacitance. By design, the nearest clamp turn off time may be to ensure that the ESD-induced voltage is discharged to safe value below functional voltage level after an ESD event. Any further clamps will be turned off later, which is even safer for chip protection and reliability. Moreover, the timing variation for the turn off timing may be very small compared to the designed value and acceptable for ESD design.

The following simulation results shown in TABLES 1-7 illustrate an example of how the reducing impedance approach and the constant impedance approach may provide improved performance as compared to a conventional approach. It should be appreciated that the values set forth in Tables 1-7 below are merely one example of possible values that could be achieved using the teachings herein. Other values may be obtained in other embodiments (e.g., different devices implemented using different technologies may provide different values). Nevertheless, Tables 1-7 serve to illustrate that the disclosed approaches are both effective and may provide significant advantages as compared to conventional approaches.

Table 1 illustrates one example of how the reducing impedance approach and the constant impedance approach may meet ESD design requirements for an ESD event from the I/O pad 304 to VEXTQ 312 of FIG. 3.

TABLE 1

Pad to VEXTQ Zap

| Clamp block count | Increase Drive and Conductance 1 Reducing Impedance Simulation Result | | Constant Drive and Conductance 2 Constant Impedance Simulation Result | |
|---|---|---|---|---|
| | Pad2VEXTQ | VEXTQ2VSS | Pad2VEXTQ | VEXTQ2VSS |
| 1 | 1.49 | | | |
| 2 | 1.49 | 0.046 | 1.53 | 0.015 |
| 4 | 1.49 | 0.025 | 1.53 | 0.023 |
| 10 | 1.49 | 0.018 | 1.53 | 0.036 |
| 20 | 1.49 | 0.021 | 1.53 | 0.015 |

Table 2 illustrates one example of how the reducing impedance approach and the constant impedance approach may meet ESD design requirements for an ESD event from VEXTQ 312 to VSS 310 of FIG. 3.

TABLE 2

VEXTQ to VSS Zap

| Clamp block count | Increase Drive and Conductance 1 Reducing Impedance Simulation Result | | Constant Drive and Conductance 2 Constant Impedance Simulation Result | |
|---|---|---|---|---|
| | Pad2VEXTQ | VEXTQ2VSS | Pad2VEXTQ | VEXTQ2VSS |
| 1 | | | | |
| 2 | 0.46 | 1.01 | 0.51 | 1.1 |
| 4 | 0.45 | 0.98 | 0.51 | 1.09 |
| 10 | 0.43 | 0.95 | 0.51 | 1.09 |
| 20 | 0.42 | 0.93 | 0.51 | 1.08 |

Table 3 illustrates one example of how the reducing impedance approach and the constant impedance approach may meet ESD design requirements for an ESD event from VSS 310 to VEXTQ 312 of FIG. 3.

TABLE 3

VSS to VEXTQ Zap

| Clamp block count | Increase Drive and Conductance 1 Reducing Impedance Simulation Result | | Constant Drive and Conductance 2 Constant Impedance Simulation Result | |
|---|---|---|---|---|
| | Pad2VEXTQ | VEXTQ2VSS | Pad2VEXTQ | VEXTQ2VSS |
| 1 | | | | |
| 2 | 1.22 | 2.96 | 1.22 | 3.1 |
| 4 | 1.23 | 2.56 | 1.22 | 3.1 |

TABLE 3-continued

VSS to VEXTQ Zap

| Clamp block count | Increase Drive and Conductance 1 Reducing Impedance Simulation Result | | Constant Drive and Conductance 2 Constant Impedance Simulation Result | |
|---|---|---|---|---|
| | Pad2VEXTQ | VEXTQ2VSS | Pad2VEXTQ | VEXTQ2VSS |
| 10 | 1.22 | 2.22 | 1.23 | 3.2 |
| 20 | 1.2 | 2.1 | 1.23 | 3.25 |

Tables 4 and 5 illustrate one example of how the reducing impedance approach and the constant impedance approach, respectively, may result in lower leakage current (Ileak) than the conventional approach. In these tables, the leakage current is shown for 1 clamp, 2 clamps, 4 clamps, 10 clamps, and 20 claims. Here, it may be seen that the constant impedance approach may yield significant savings in leakage current (e.g., lower standby power consumption).

TABLE 4

| Original Method Replicating instance | | Proposed Method 1. Reducing Impedance | | % Ileak Change wrt Original Method |
|---|---|---|---|---|
| Count | Ileak (pA) | | Ileak (pA) | |
| Trigger | 729 | Trigger | 457 | |
| Clamp | 10231 | Clamp | 10503 | |
| 1× | 10960 | 1× | 10960 | 0.0% |
| 2× | 21920 | 2× | 21463 | −2.1% |
| 4× | 43840 | 4× | 42469 | −3.1% |
| 10× | 109600 | 10× | 105487 | −3.8% |
| 20× | 219200 | 20× | 210517 | −4.0% |

TABLE 5

| Original Method Replicating instance | | Proposed Method 2. Constant Impedance | | % Ileak Change wrt Original Method |
|---|---|---|---|---|
| Count | Ileak (Pa) | | Ileak (Pa) | |
| Trigger | 729 | Trigger | 457 | |
| Clamp | 10231 | Clamp | 10503 | |
| 1× | 10960 | 1× | 10960 | 0.0% |
| 2× | 21920 | 2× instances | 21463 | −2.1% |
| 4× | 43840 | 4× instances | 21463 | −51.0% |
| 10× | 109600 | 10× instances | 21463 | −80.4% |
| 20× | 219200 | 20× instances | 21463 | −90.2% |

Tables 6 and 7 illustrate one example of how the reducing impedance approach and the constant impedance approach, respectively, may result in a reduction in the area used for ESD protection circuitry as compared to the conventional approach. In these tables, the area is shown for 1 clamp, 2 clamps, 4 clamps, 10 clamps, and 20 claims. Here, it may be seen that both approaches may yield significant savings in area used.

TABLE 6

| Original Method Replicating instance | | Proposed Method 1. Reducing Impedance | | % Area Change |
|---|---|---|---|---|
| Count | Area um^2 | | Area um^2 | wrt Original |
| Trigger | 3134 | Trigger | 3134 | |
| Clamp | 2080 | Clamp | 2080 | |
| 1× | 5214 | 1× | 5214 | 0.0% |
| 2× | 10428 | 2× | 7294 | −30.1% |
| 4× | 20856 | 4× | 11454 | −45.1% |
| 10× | 52140 | 10× | 23934 | −54.1% |
| 20× | 104280 | 20× | 44734 | −57.1% |

TABLE 7

| Original Method Replicating instance | | Proposed Method 2. Constant Impedance | | % Area Change |
|---|---|---|---|---|
| Count | Area um^2 | | Area um^2 | wrt Original |
| Trigger | 3134 | Trigger | 3134 | |
| Clamp | 2080 | Clamp | 2080 | |
| 1× | 5214 | 1× | 5214 | 0.0% |
| 2× | 10428 | 2× instances | 5214 | −50.0% |
| 4× | 20856 | 4× instances | 5214 | −75.0% |
| 10× | 52140 | 10× instances | 5214 | −90.0% |
| 20× | 104280 | 20× instances | 5214 | −95.0% |

Example Memory System

The teachings herein may be used in a memory system that includes NAND memory technology. A NAND device may be referred to herein as a NAND Flash memory, a NAND memory device, a NAND flash, or a NAND. Generally speaking, a NAND device is a non-volatile memory having high storage density, fast access time, low power requirements in operation and advantageous shock resistance, compared to more conventional memory platforms. Raw NAND devices may be equipped (e.g., configured) with a serial interface such as Open NAND Flash Interface (ONFi), Common Flash Memory Interface (CFI), and the like. NAND devices may be configured as discrete memory chips or packaged with a controller to form a secure digital (SD) memory card, Multi Media Card (MMC), or a solid state disk. A NAND device may be configured with a single flash die, or a plurality of dies. In addition to memory cells, a NAND device may include other components, such as control/address logic components, I/O components, and data register components. It should be appreciated that the teachings herein are also applicable to other forms of memory (e.g., NVM other than NAND devices).

Figure 14:
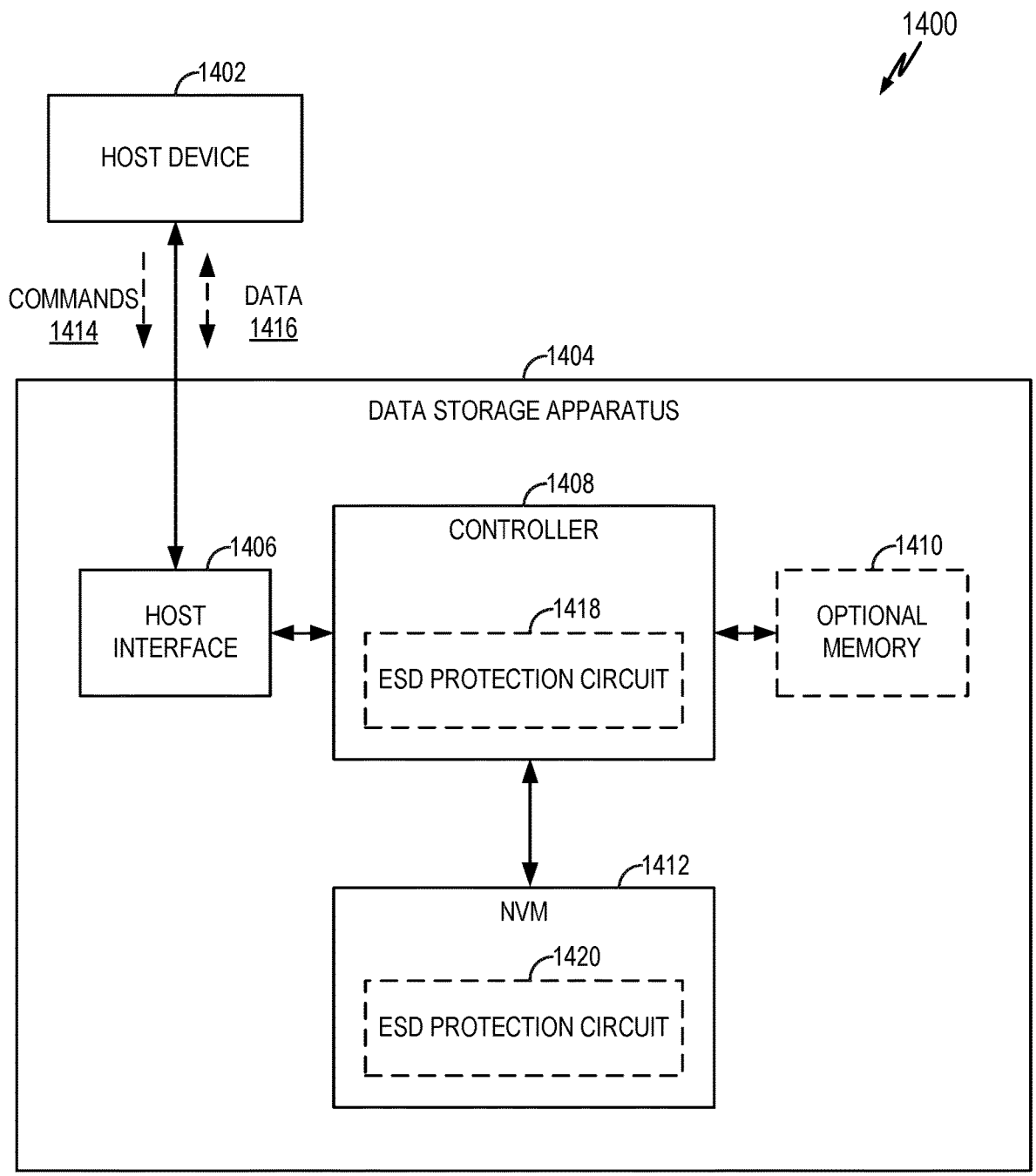
FIG. 14 illustrates an example memory system including a solid state data storage device (e.g., a solid state drive) configured in accordance with one or more aspects of the disclosure.

FIG. 14 illustrates an embodiment of a memory system 1400 that includes a host device 1402 and data storage apparatus 1404 communicatively coupled to the host device 1402. In some embodiments, the data storage apparatus 1404 may be a solid state device (SSD). In some embodiments, an SSD may be a solid state drive.

The host device (e.g., a host computer) 1402 provides commands to the data storage apparatus 1404 for transferring data between the host device 1402 and the data storage apparatus 1404. For example, the host device 1402 may provide a write command to the data storage apparatus 1404 for writing data to the data storage apparatus 1404 or a read command to the data storage apparatus 1404 for reading data from the data storage apparatus 1404. The host device 1402 may be any system or device having a need for data storage or retrieval and a compatible interface for communicating with the data storage apparatus 1404. For example, the host device 1402 may a computing device, a personal computer, a portable computer, or workstation, a server, a personal digital assistant, a digital camera, a digital phone, or the like.

The data storage apparatus 1404 includes a host interface 1406, a controller 1408, an optional memory 1410, and a non-volatile memory (NVM) 1412. The host interface 1406 is coupled to the controller 1408 and facilitates communication between the host device 1402 and the controller 1408. Additionally, the controller 1408 is coupled to the memory 1410 and the NVM 1412. The host interface 1406 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host device 1402 includes the data storage apparatus 1404 (e.g., the host device 1402 and the data storage apparatus 1404 are implemented as a single component). In other embodiments, the data storage apparatus 1404 is remote with respect to the host device 1402 or is contained in a remote computing system coupled in communication with the host device 1402. For example, the host device 1402 may communicate with the data storage apparatus 1404 through a wireless communication link.

The controller 1408 controls operation of the data storage apparatus 1404. In various embodiments, the controller 1408 receives commands 1414 from the host device 1402 through the host interface 1406 and performs the commands to transfer data 1416 between the host device 1402 and the NVM 1412. In addition, the controller 1408 performs internal operations such as garbage collection operations, data integrity operations, and wear leveling operations. The controller 1408 may include any type of processing device, such as a microprocessor, a microcontroller, an embedded controller, a logic circuit, software, firmware, or the like, for controlling operation of the data storage apparatus 1404.

In some embodiments, some or all of the functions described herein as being performed by the controller 1408 may instead be performed by another element of the data storage apparatus 1404. For example, the data storage apparatus 1404 may include a microprocessor, a microcontroller, an embedded controller, a logic circuit, software, firmware, or any kind of processing device, for performing one or more of the functions described herein as being performed by the controller 1408. In some embodiments, one or more of the functions described herein as being performed by the controller 1408 are instead performed by the host device 1402. In some embodiments, some or all of the functions described herein as being performed by the controller 1408 may instead be performed by another element such as a controller in a hybrid drive including both non-volatile memory elements and magnetic storage elements.

The memory 1410 may be any memory, computing device, or system capable of storing data. For example, the memory 1410 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the controller 1408 uses the memory 1410, or a portion thereof, to store data during the transfer of data between the host device 1402 and the NVM 1412. For example, the memory 1410 or a portion of the memory 1410 may be a cache memory.

The teachings herein may be used to protect any of the circuitry of the data storage apparatus 1404. In general, ESD protection as taught herein may be used to ensure that an ESD event is well controlled in the face of any handling of the corresponding packaging/packaged part. For example, ESD protection may be used for the data storage apparatus 1404 and/or any component of the data storage apparatus 1404 that has external connectivity. Several specific examples follow.

In some embodiments (e.g., in cases where the controller 1408 is an integrated circuit or other circuitry that has external connectivity), the controller 1408 includes an ESD protection circuit 1418. For example, ESD protection may be provided for one or more of external I/O pads or other nodes or signal paths of the controller 1408.

In some embodiments (e.g., in cases where the NVM 1412 is an integrated circuit or other circuitry that has external connectivity), the NVM 1412 includes an ESD protection circuit 1420. For example, ESD protection may be provided for one or more of external I/O pads or other nodes or signal paths of the NVM 1412.

Example SSD

Figure 15:
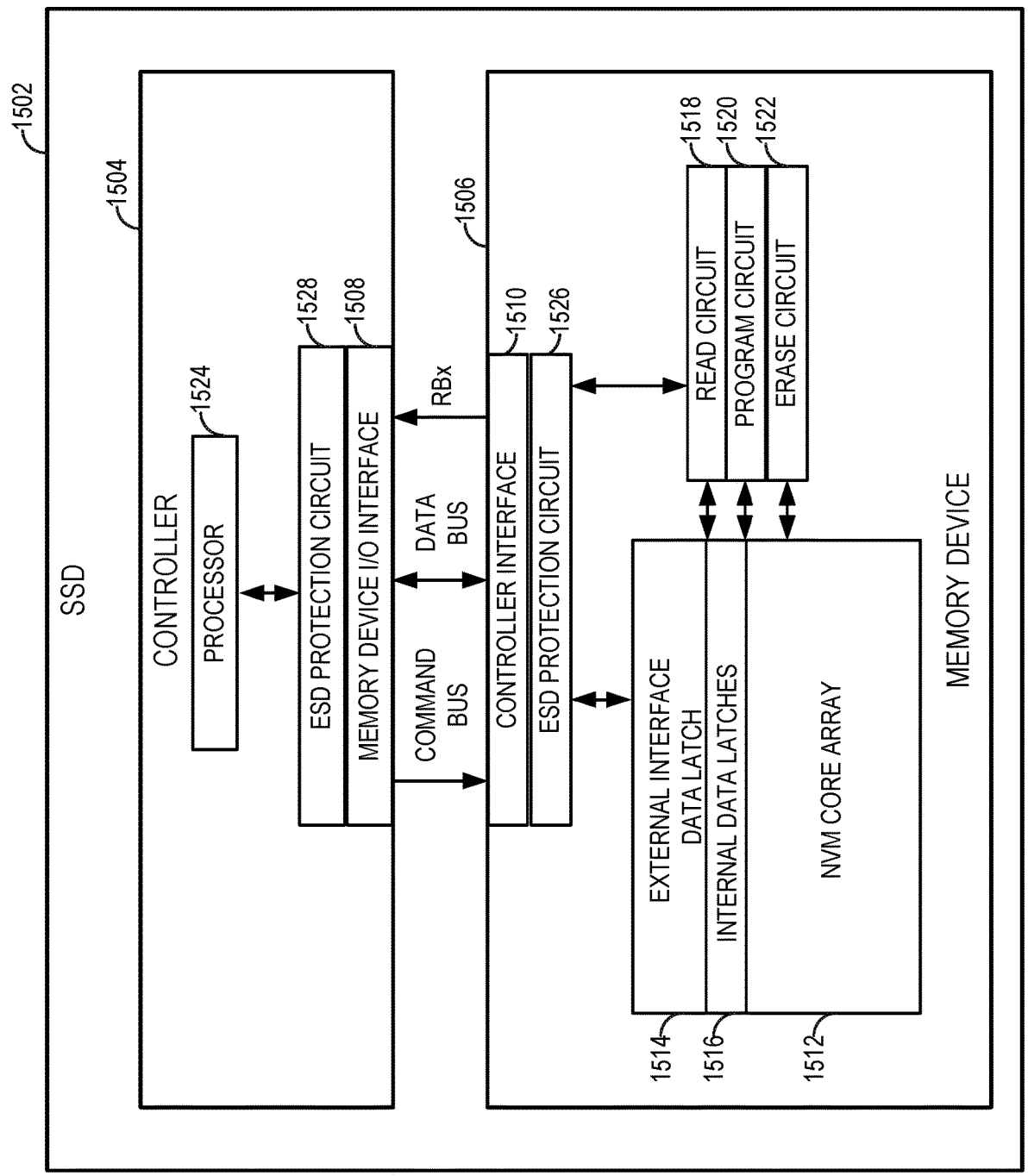
FIG. 15 illustrates an example SSD configured in accordance with one or more aspects of the disclosure.

FIG. 15 illustrates an embodiment of an SSD 1502 that may use ESD protection as taught herein. The SSD 1502 includes a controller 1504 that writes data to and reads data from a memory device 1506 (e.g., an NVM), and performs other associated data storage operations.

The controller 1504 and the memory device 1506 communicate with one another via corresponding interfaces. The controller 1504 includes a memory device input/output (I/O) interface 1508 (i.e., an interface for communicating with the memory device 1506) for sending commands from a processor 1524 to the memory device 1506 (e.g., via a command bus), sending data to and receiving data from the memory device 1506 (e.g., via a data bus), and for sending and receiving other signaling as applicable (e.g., a read/busy indication (RBx) generated by the memory device 1506). Similarly, the memory device 1506 includes a controller interface 1510 (i.e., an interface for communicating with the controller 1504) for receiving commands from the controller 1504 (e.g., via a command bus), sending data to and receiving data from the controller 1504 (e.g., via a data bus), and for sending and receiving other signaling as applicable (e.g., RBx).

The memory device 1506 includes an NVM core array 1512 for storing data, an external interface data latch 1514 for outputting stored data to and receiving data to be stored from the controller interface 1510, and a set of internal data latches 1516 for storing operational data that is used by the memory device 1506. The memory device 1506 also includes a read circuit 1518 for reading data from the multi-tier NVM core array 1512, a program circuit 1520 for writing data to the multi-tier NVM core array 1512, and an erase circuit 1522 for erasing data in the multi-tier NVM core array 1512.

The memory device 1506 may include an ESD protection circuit 1526. For example, ESD protection may be provided for one or more pads and/or signal paths of the controller interface 1510. ESD protection may be provided for other pads and/or signal paths of the memory device 1506.

The controller 1504 may include an ESD protection circuit 1528. For example, ESD protection may be provided for one or more pads and/or signal paths of the memory device I/O interface 1508. ESD protection may be provided for other pads and/or signal paths of the controller 1504.

Example Host Device

Figure 16:
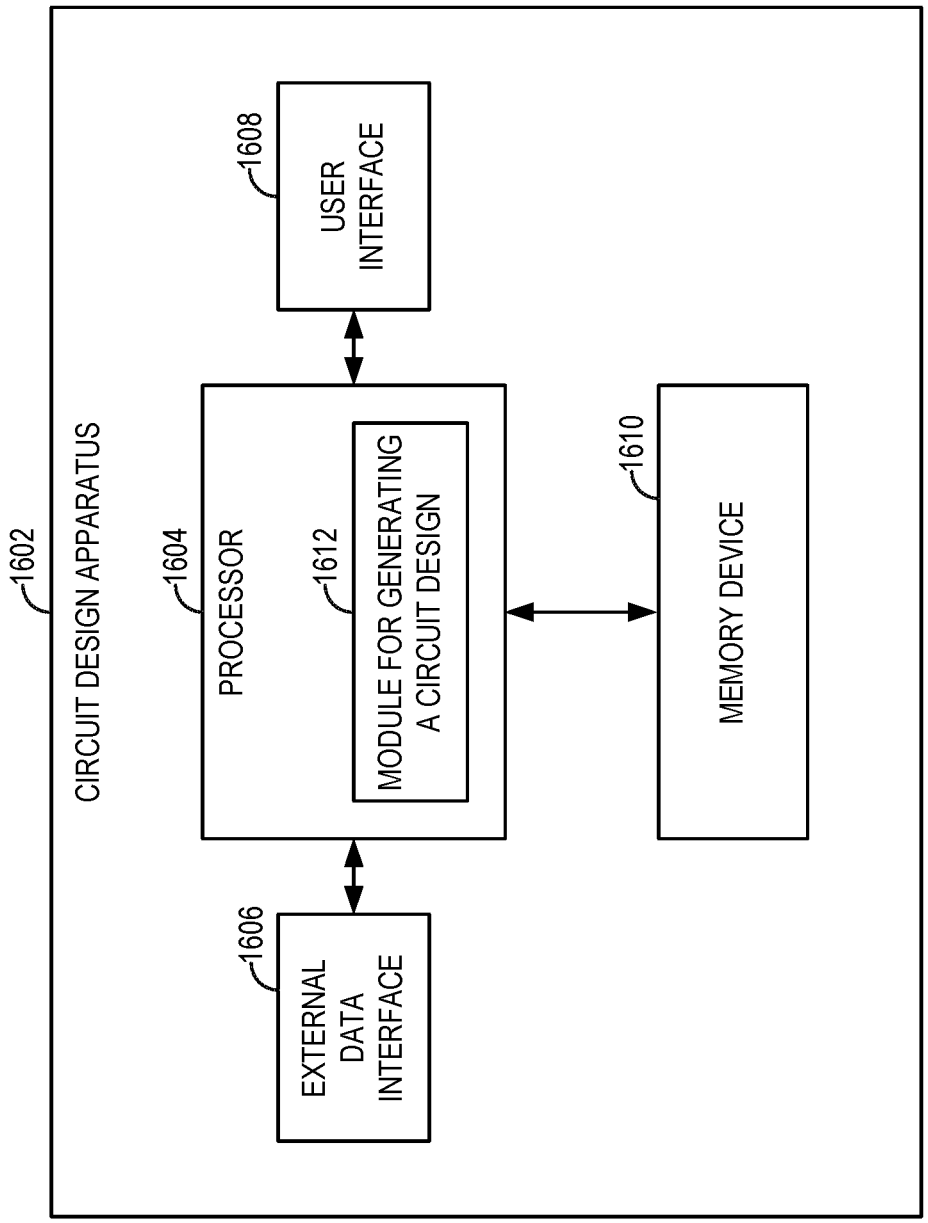
FIG. 16 illustrates an example circuit design apparatus configured in accordance with one or more aspects of the disclosure.

FIG. 16 illustrates an embodiment of a circuit design apparatus 1602 that may generate a circuit with ESD protection as taught herein. The circuit design apparatus 1602 includes a processor 1604 for generating a circuit design. The processor 1604 communicates with other devices (e.g., a data storage device) via a data interface 1606. The processor 1604 includes a user interface 1608 (e.g., an input/output (I/O) interface) for receiving instructions, data, etc., from a user and for sending responses, data, etc., to a user (not shown). The processor 1604 also includes a memory device for storing information related to the operations of the circuit design apparatus 1602.

In accordance with the teachings herein, the circuit design apparatus 1602 includes a module for generating a circuit design 1612 that may be configured to perform one or more of the operations described herein. For example, the module for generating a circuit design 1612 may perform one or more of the ESD protection circuit design operations described herein in conjunction with FIGS. 8, 9, 12, 13, and 18.

First Example Apparatus

Figure 17:
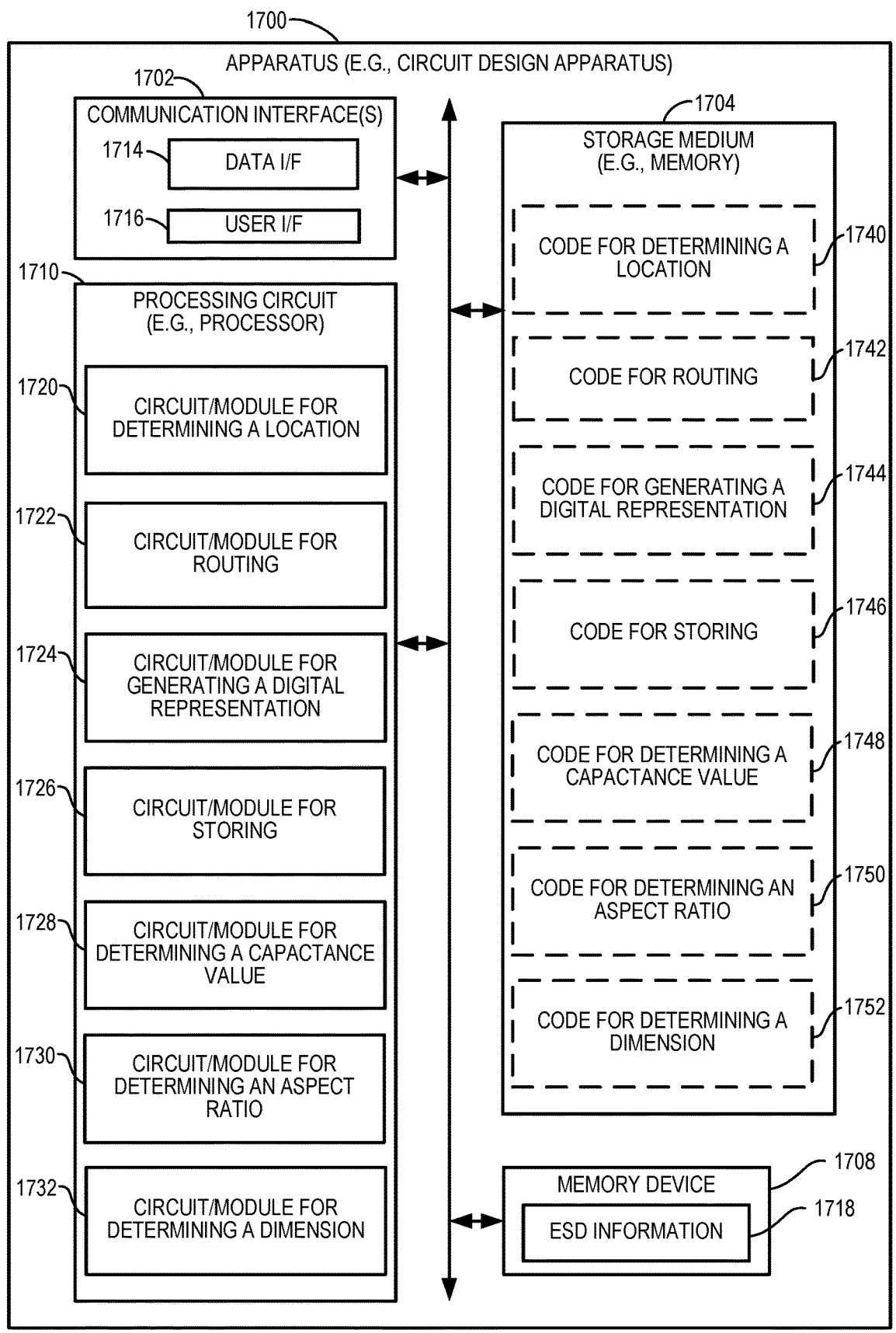
FIG. 17 illustrates an example hardware implementation for an apparatus (e.g., an electronic device) for circuit design in accordance with one or more aspects of the disclosure.

FIG. 17 illustrates an embodiment of an apparatus 1700 configured to generate a circuit design according to one or more aspects of the disclosure. The apparatus 1700 could embody or be implemented within a computer, a server, or some other type of device that supports circuit design.

The apparatus 1700 includes a communication interface 1702, a storage medium 1704, a memory device 1708, and a processing circuit 1710 (e.g., at least one processor and/or other suitable circuitry). These components can be coupled to and/or placed in electrical communication with one another via a signaling bus or other suitable component, represented generally by the connection lines in FIG. 17. The signaling bus may include any number of interconnecting buses and bridges depending on the specific application of the processing circuit 1710 and the overall design constraints. The signaling bus links together various circuits such that each of the communication interface 1702, the storage medium 1704, and the memory device 1708 are coupled to and/or in electrical communication with the processing circuit 1710. The signaling bus may also link various other circuits (not shown) such as timing sources, peripherals, voltage regulators, and power management circuits, which are well known in the art, and therefore, will not be described any further.

The communication interface 1702 provides a means for communicating with other apparatuses over a transmission medium. In some implementations, the communication interface 1702 includes circuitry and/or programming (e.g., a program) adapted to facilitate the communication of information bi-directionally with respect to one or more devices in a system. In some implementations, the communication interface 1702 may be configured for wire-based communication. For example, the communication interface 1702 could be a bus interface, a send/receive interface, or some other type of signal interface including drivers, buffers, or other circuitry for outputting and/or obtaining signals (e.g., outputting signal from and/or receiving signals into an integrated circuit). The communication interface 1702 serves as one example of a means for receiving and/or a means for transmitting. In some implementations, the communication interface 1702 may be configured for wireless communication. In some implementations, the communication interface includes a host interface 1714. In some implementations, the communication interface may include at least one other interface 1716. For example, the communication interface 1702 may include at least one radio frequency (RF) receiver and/or RF transmitter (e.g., collectively an RF transceiver).

The memory device 1708 may represent one or more memory devices. As indicated, the memory device 1708 may maintain ESD information 1718 along with other information used by the apparatus 1700. In some implementations, the memory device 1708 and the storage medium 1704 are implemented as a common memory component. The memory device 1708 may also be used for storing data that is manipulated by the processing circuit 1710 or some other component of the apparatus 1700.

The storage medium 1704 may represent one or more computer-readable, machine-readable, and/or processor-readable devices for storing programming, such as processor executable code or instructions (e.g., software, firmware), electronic data, databases, or other digital information. The storage medium 1704 may also be used for storing data that is manipulated by the processing circuit 1710 when executing programming. The storage medium 1704 may be any available media that can be accessed by a general purpose or special purpose processor, including portable or fixed storage devices, optical storage devices, and various other mediums capable of storing, containing or carrying programming.

By way of example and not limitation, the storage medium 1704 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1704 may be embodied in an article of manufacture (e.g., a computer program product). By way of example, a computer program product may include a computer-readable medium in packaging materials. In view of the above, in some implementations, the storage medium 1704 may be a non-transitory (e.g., tangible) storage medium. For example, the storage medium 1704 may be a non-transitory computer-readable medium storing computer-executable code, including code to perform operations as described herein.

The storage medium 1704 may be coupled to the processing circuit 1710 such that the processing circuit 1710 can read information from, and write information to, the storage medium 1704. That is, the storage medium 1704 can be coupled to the processing circuit 1710 so that the storage medium 1704 is at least accessible by the processing circuit 1710, including examples where at least one storage medium is integral to the processing circuit 1710 and/or examples where at least one storage medium is separate from the processing circuit 1710 (e.g., resident in the apparatus 1700, external to the apparatus 1700, distributed across multiple entities, etc.).

Programming stored by the storage medium 1704, when executed by the processing circuit 1710, causes the processing circuit 1710 to perform one or more of the various functions and/or process operations described herein. For example, the storage medium 1704 may include operations configured for regulating operations at one or more hardware blocks of the processing circuit 1710, as well as to utilize the communication interface 1702 for wireless communication utilizing their respective communication protocols.

The processing circuit 1710 is generally adapted for processing, including the execution of such programming stored on the storage medium 1704. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1710 is arranged to obtain, process and/or send data, control data access and storage, issue commands, and control other desired operations. The processing circuit 1710 may include circuitry configured to implement desired programming provided by appropriate media in at least one example. For example, the processing circuit 1710 may be implemented as one or more processors, one or more controllers, and/or other structure configured to execute executable programming Examples of the processing circuit 1710 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1710 may also be implemented as a combination of computing components, such as a combination of a controller and a microprocessor, a number of microprocessors, one or more microprocessors in conjunction with an ASIC and a microprocessor, or any other number of varying configurations. These examples of the processing circuit 1710 are for illustration and other suitable configurations within the scope of the disclosure are also contemplated.

According to one or more aspects of the disclosure, the processing circuit 1710 may be adapted to perform any or all of the features, processes, functions, operations and/or routines for any or all of the apparatuses described herein. For example, the processing circuit 1710 may be configured to perform any of the steps, functions, and/or processes described with respect to FIGS. 8, 9, 12, 13, and 18. As used herein, the term "adapted" in relation to the processing circuit 1710 may refer to the processing circuit 1710 being one or more of configured, employed, implemented, and/or programmed to perform a particular process, function, operation and/or routine according to various features described herein.

The processing circuit 1710 may be a specialized processor, such as an application-specific integrated circuit (ASIC) that serves as a means for (e.g., structure for) carrying out any one of the operations described in conjunction with FIGS. 8, 9, 12, 13, and 18. The processing circuit 1710 serves as one example of a means for sending and/or a means for receiving. In various implementations, the processing circuit 1710 may provide and/or incorporate, at least in part, the functionality described above for the circuit design apparatus 1602 of FIG. 16.

According to at least one example of the apparatus 1700, the processing circuit 1710 may include one or more of a circuit/module for determining a location 1720, a circuit/module for routing 1722, a circuit/module for generating a digital representation 1724, a circuit/module for storing 1726, a circuit/module for determining a capacitance value 1728, or a circuit/module for determining an aspect ratio 1730. In various implementations, the circuit/module for determining a location 1720, the circuit/module for routing 1722, the circuit/module for generating a digital representation 1724, the circuit/module for storing 1726, the circuit/module for determining a capacitance value 1728, or the circuit/module for determining an aspect ratio 1730 may provide and/or incorporate, at least in part, the functionality described above for the circuit design apparatus 1602 of FIG. 16.

As mentioned above, a program stored by the storage medium 1704, when executed by the processing circuit 1710, causes the processing circuit 1710 to perform one or more of the various functions and/or process operations described herein. For example, the program may cause the processing circuit 1710 to perform the various functions, steps, and/or processes described herein with respect to FIGS. 8, 9, 12, 13, and 18 in various implementations. As shown in FIG. 17, the storage medium 1704 may include one or more of code for determining a location 1740, code for routing 1742, code for generating a digital representation 1744, code for storing 1746, code for determining a capacitance value 1748, or code for determining an aspect ratio 1750. In various implementations, the code for determining a location 1740, the code for routing 1742, the code for generating a digital representation 1744, the code for storing 1746, code for determining a capacitance value 1748, or the code for determining an aspect ratio 1750 may be executed or otherwise used to provide the functionality described herein for the circuit/module for determining a location 1720, the circuit/module for routing 1722, the circuit/module for generating a digital representation 1724, the circuit/module for storing 1726, the circuit/module for determining a capacitance value 1728, or the circuit/module for determining an aspect ratio 1730.

First Example Process

Figure 18:
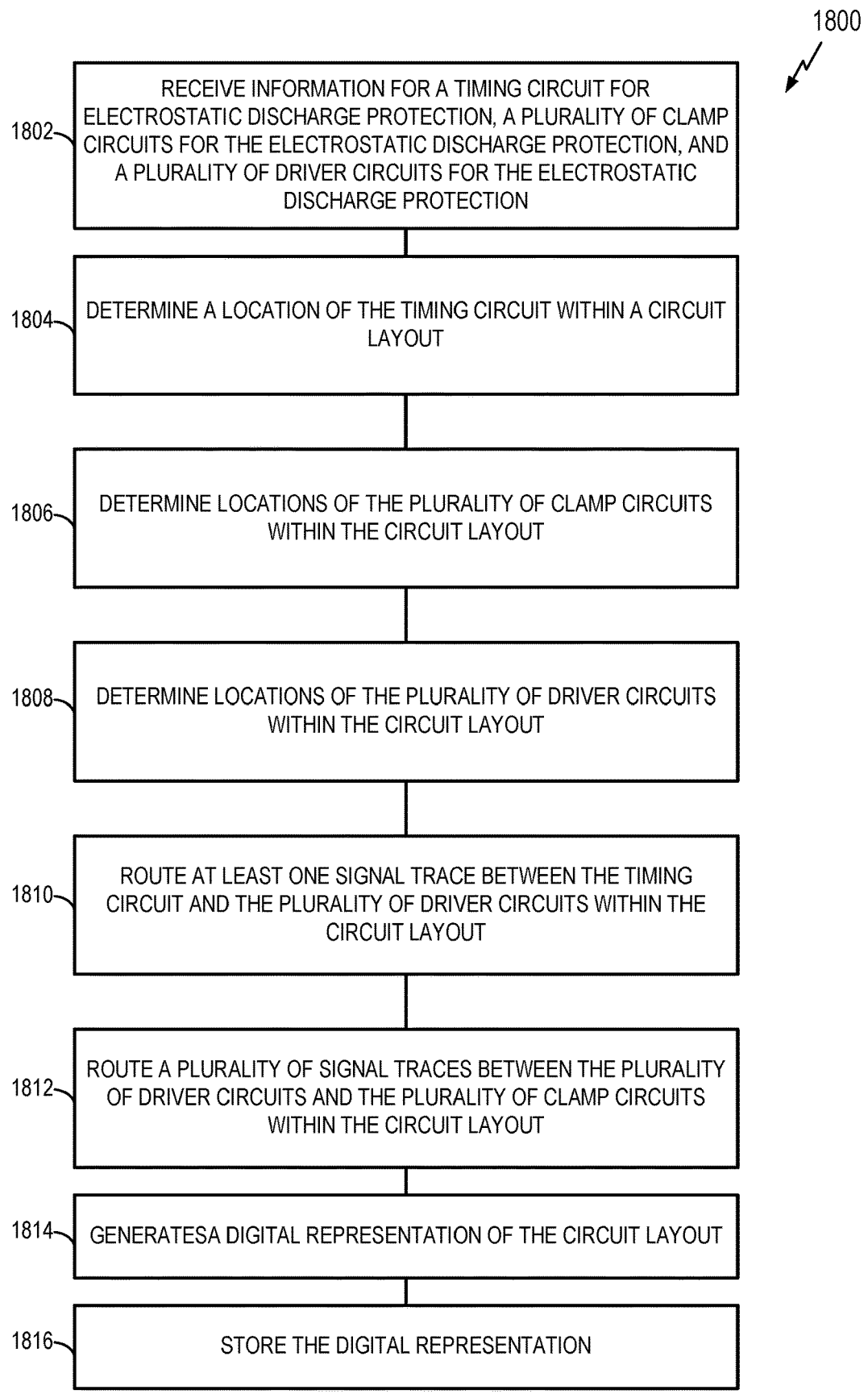
FIG. 18 illustrates an example circuit design process in accordance with one or more aspects of the disclosure.

FIG. 18 illustrates a process 1800 for communication in accordance with some aspects of the disclosure. The process 1800 may take place within a processing circuit (e.g., the processing circuit 1710 of FIG. 17), which may be located in a circuit design apparatus, or some other suitable apparatus. Of course, in various aspects within the scope of the disclosure, the process 1800 may be implemented by any suitable apparatus capable of supporting memory-related operations.

At block 1802, an apparatus (e.g., a circuit design apparatus) receives information for a timing circuit for electrostatic discharge protection, a plurality of clamp circuits for the electrostatic discharge protection, and a plurality of driver circuits for the electrostatic discharge protection.

At block 1804, the apparatus determines a location of the timing circuit within a circuit layout.

At block 1806, the apparatus determines locations of the plurality of clamp circuits within the circuit layout.

At block 1808, the apparatus determines locations of the plurality of driver circuits within the circuit layout.

At block 1810, the apparatus routes at least one signal trace between the timing circuit and the plurality of driver circuits within the circuit layout.

At block 1812, the apparatus routes a plurality of signal traces between the plurality of driver circuits and the plurality of clamp circuits within the circuit layout.

At block 1814, the apparatus generates a digital representation of the circuit layout.

At block 1816, the apparatus stores the digital representation of the circuit layout.

In some aspects, a process in accordance with the teachings herein may include any combination of the above operations.

Additional Aspects

The disclosure relates in some aspects to a data storage apparatus that includes: a non-volatile memory array; an interface coupled to the non-volatile memory array and including at least one input-output pad; and an electrostatic discharge protection circuit. In some embodiments, the electrostatic discharge protection circuit includes: a plurality of clamp circuits coupled to the at least one input-output pad, a plurality of driver circuits coupled to the plurality of clamp circuits, and a timer circuit coupled to the plurality of driver circuits. In some aspects, a first driver circuit of the plurality of driver circuits may be configured to turn on a first clamp circuit of the plurality of clamp circuits in response to an electrostatic discharge event; and a second driver circuit of the plurality of driver circuits may be configured to turn on a second clamp circuit of the plurality of clamp circuits in response to the electrostatic discharge event. In some aspects, the timer circuit may be configured to turn off the first clamp circuit and the second clamp circuit after a delay period following the electrostatic discharge event.

Other Aspects

The examples set forth herein are provided to illustrate certain concepts of the disclosure. The apparatuses, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein.

Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," and variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "I" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An electrostatic discharge protection circuit, comprising:
   a first clamp circuit directly coupled to an external signal path;
   a second clamp circuit directly coupled to the external signal path;
   a first driver circuit coupled to the first clamp circuit to turn on the first clamp circuit in response to an electrostatic discharge event on the external signal path;
   a second driver circuit coupled to the second clamp circuit to turn on the second clamp circuit in response to the electrostatic discharge event; and
   a first timer circuit coupled to the first driver circuit and the second driver circuit to turn off the first clamp circuit and the second clamp circuit after a delay period following the electrostatic discharge event.

2. The electrostatic discharge protection circuit of claim 1, further comprising:
   at least one other clamp circuit; and
   at least one other driver circuit coupled to the at least one other clamp circuit,
   wherein the first timer circuit is coupled to the at least one other driver circuit to turn off the at least one other clamp circuit after the delay period following the electrostatic discharge event.

3. The electrostatic discharge protection circuit of claim 1, wherein the delay period is based on at least one capacitive element of the first timer circuit and routing capacitance between the first timer circuit and the first clamp circuit and the second clamp circuit.

4. The electrostatic discharge protection circuit of claim 1, wherein the delay period is further based on:
   routing capacitance associated with the first driver circuit; and
   routing capacitance associated with the second driver circuit.

5. The electrostatic discharge protection circuit of claim 1, wherein:
   the electrostatic discharge protection circuit is implemented in an integrated circuit die;
   the electrostatic discharge protection circuit comprises a plurality of clamp circuits including the first clamp circuit and the second clamp circuit;
   the electrostatic discharge protection circuit comprises a plurality of timer circuits including the first timer circuit; and
   a quantity of the plurality of clamps circuits controlled by one of the plurality of timer circuits is based on a width of the integrated circuit die.

6. The electrostatic discharge protection circuit of claim 1, wherein:
   the electrostatic discharge protection circuit is implemented in an integrated circuit die; and
   a Y-dimension of the first clamp circuit and the second clamp circuit is based on an X-dimension of the integrated circuit die.

7. The electrostatic discharge protection circuit of claim 1, wherein the first clamp circuit and the second clamp circuit are coupled to at least one input-output pad of a data storage apparatus comprising a non-volatile memory array.

8. An electrostatic discharge protection circuit, comprising:
   a plurality of means for clamping, wherein each of the plurality of means for clamping is directly coupled to a same external signal path;
   a plurality of means for turning on the plurality of means for clamping in response to an electrostatic discharge event on the same external signal path; and
   a means for turning off the plurality of means for clamping after a delay period following the electrostatic discharge event.

9. The electrostatic discharge protection circuit of claim 8, wherein the delay period is based on at least one capacitor element of the means for turning off the plurality of means for clamping and a routing capacitance between the means for turning off the plurality of means for clamping and the plurality of means for clamping.

10. The electrostatic discharge protection circuit of claim 8, further comprising:
a first signal trace between the means for turning off the plurality of means for clamping and a first means for clamping of the plurality of means for clamping; and
a second signal trace between the means for turning off the first means for clamping of the plurality of means for clamping and a second means for clamping of the plurality of means for clamping.

11. The electrostatic discharge protection circuit of claim 8, wherein the plurality of means for clamping are coupled to at least one external signal path of a means for storing data.

12. A circuit design method, comprising:
receiving information for a timer circuit for electrostatic discharge protection, a plurality of clamp circuits for the electrostatic discharge protection, and a plurality of driver circuits for the electrostatic discharge protection;
determining a location of the timer circuit within a circuit layout;
determining locations of the plurality of clamp circuits within the circuit layout, wherein each of the plurality of clamp circuits is directly coupled to a same external signal path;
determining locations of the plurality of driver circuits within the circuit layout;
routing at least one signal trace between the timer circuit and the plurality of driver circuits within the circuit layout;
routing a plurality of signal traces between the plurality of driver circuits and the plurality of clamp circuits within the circuit layout such that each of the plurality of driver circuits turns on a respective one of the plurality of clamp circuits in response to an electrostatic discharge event on the same external signal path;
generating a digital representation of the circuit layout; and
storing the digital representation of the circuit layout.

13. The method of claim 12, further comprising:
determining a routing capacitance of the at least one signal trace and the plurality of signal traces; and
determining a capacitance value for a capacitive element of the timer circuit based on the routing capacitance.

14. The method of claim 13, wherein the capacitive element comprises at least one capacitor of a resistance-capacitance delay circuit.

15. The method of claim 14, wherein determining the capacitance value comprises:
determining an initial capacitance value for the resistance-capacitance delay circuit to meet a turn-off delay time; and
subtracting the routing capacitance from the initial capacitance value.

16. The method of claim 12, further comprising:
determining an aspect ratio of at least one module of the circuit layout; and
determining a capacitance value for a capacitive element of the timer circuit based on the aspect ratio.

17. The method of claim 16, wherein determining the capacitance value comprises:
determining at least one impedance of the plurality of clamp circuits based on the aspect ratio.

18. The method of claim 16, wherein the at least one module comprises at least one of: at least one of the plurality of clamp circuits, at least one of the plurality of driver circuits, or the timer circuit.

19. The method of claim 12, further comprising:
determining a width of an integrated circuit die for the circuit design; and
selecting a quantity of the plurality of clamps circuits controlled by the timer circuit based on the width of the integrated circuit die.

20. The method of claim 12, further comprising:
determining an X-dimension of an integrated circuit die for the circuit design; and
selecting a Y-dimension of the plurality of clamps circuits based on the X-dimension of the integrated circuit die.

* * * * *